(12) United States Patent
Deakin

(10) Patent No.: US 9,694,894 B2
(45) Date of Patent: Jul. 4, 2017

(54) AERIAL VEHICLE AND METHOD OF FLIGHT

(71) Applicant: Athene Works Limited, Leeds, Yosrkshire (GB)

(72) Inventor: Nicholas James Deakin, Leeds (GB)

(73) Assignee: Athene Works Limited, Leeds, Yorkshire (GB)

( * ) Notice: Subject to any disclaimer, the term of this patent is extended or adjusted under 35 U.S.C. 154(b) by 0 days.

(21) Appl. No.: 14/324,306

(22) Filed: Jul. 7, 2014

(65) Prior Publication Data

US 2014/0339356 A1 Nov. 20, 2014

Related U.S. Application Data

(63) Continuation of application No. 13/636,583, filed as application No. PCT/GB2011/050562 on Mar. 22, 2011, now abandoned.

(30) Foreign Application Priority Data

Mar. 23, 2010 (GB) .................................. 1004803.1

(51) Int. Cl.
*B64B 1/20* (2006.01)
*B64B 1/02* (2006.01)
(Continued)

(52) U.S. Cl.
CPC .................. *B64B 1/02* (2013.01); *B64B 1/08* (2013.01); *B64B 1/10* (2013.01); *B64B 1/12* (2013.01);
(Continued)

(58) Field of Classification Search
CPC .... B64B 1/62; B64B 1/40; B64B 1/00; B64B 1/20; B64B 1/58; B64B 1/06; B64B 1/08;
(Continued)

(56) References Cited

U.S. PATENT DOCUMENTS 2,004,411 A * 6/1935 Krug .............................. 244/125
2,140,783 A * 12/1938 Bellanca ......................... 244/13
(Continued)

FOREIGN PATENT DOCUMENTS

| DE | 10 2006 031 398 | 1/2008 |
|---|---|---|
| WO | WO00/34120 | 6/2000 |
| WO | WO2005/007506 | 1/2005 |

*Primary Examiner* — Brian M O'Hara
*Assistant Examiner* — Assres H Woldemaryam
(74) *Attorney, Agent, or Firm* — Nixon & Vanderhye P.C.

(57) ABSTRACT

An aerial vehicle comprises an elongate envelope within which are at least one first compartment for holding a lighter than air gas and at least one second compartment for holding atmospheric air and said at least one second compartment having an inlet and an outlet and at least one pair of wings extending laterally from the envelope; said wings being planar units with a leading and trailing edge, the width of the wings from their leading edges to their trailing edges being substantially less than the length of the envelope with airfoil portions fitted between the leading and trailing edges of the wing: the top and bottom of the wings are mirror images of one another; in which forward motion of the vehicle is obtainable without trust through alternate diving and climbing motion.

6 Claims, 11 Drawing Sheets

(51) Int. Cl.
*B64B 1/08* (2006.01)
*B64B 1/10* (2006.01)
*B64B 1/12* (2006.01)
*B64B 1/14* (2006.01)
*B64B 1/38* (2006.01)
*H01Q 1/36* (2006.01)
*H01Q 9/27* (2006.01)
*B64B 1/64* (2006.01)

(52) U.S. Cl.
CPC .................. *B64B 1/14* (2013.01); *B64B 1/20* (2013.01); *B64B 1/38* (2013.01); *B64B 1/64* (2013.01); *H01Q 1/36* (2013.01); *H01Q 9/27* (2013.01); *B64B 2201/00* (2013.01); *B64C 2201/042* (2013.01); *B64C 2201/044* (2013.01); *B64C 2201/048* (2013.01); *B64C 2201/101* (2013.01); *B64C 2201/122* (2013.01); *B64C 2201/127* (2013.01); *B64C 2201/165* (2013.01); *B64C 2201/167* (2013.01)

(58) Field of Classification Search
CPC ......... B64B 2201/00; B64B 1/02; B64B 1/30; B64B 1/12; B64B 1/14; B64B 1/22; B64B 1/60; B64B 1/005; B64B 1/34; B64B 1/50; B64B 1/66
USPC .................. 244/96–99, 5, 24, 25, 30, 31
See application file for complete search history.

(56) References Cited

U.S. PATENT DOCUMENTS

| | | | |
|---|---|---|---|
| 2,511,502 A * | 6/1950 | Gluhareff | 244/13 |
| 3,982,527 A * | 9/1976 | Cheng et al. | 126/690 |
| 4,850,551 A * | 7/1989 | Krawetz | B64B 1/58 244/25 |
| 5,645,248 A * | 7/1997 | Campbell | 244/30 |
| 5,810,284 A * | 9/1998 | Hibbs et al. | 244/13 |
| 6,386,480 B1 * | 5/2002 | Perry et al. | 244/24 |
| 6,425,552 B1 * | 7/2002 | Lee et al. | 244/97 |
| 6,427,943 B2 * | 8/2002 | Yokomaku et al. | 244/30 |
| 6,581,873 B2 * | 6/2003 | McDermott | 244/25 |
| 6,619,586 B1 * | 9/2003 | Barnes, III | 244/97 |
| 6,648,272 B1 * | 11/2003 | Kothmann | 244/97 |
| 6,698,686 B2 * | 3/2004 | Ogawa et al. | 244/30 |
| 6,860,449 B1 * | 3/2005 | Chen | 244/12.1 |
| 7,487,936 B2 * | 2/2009 | Heaven, Jr. | 244/30 |
| 7,776,295 B2 | 8/2010 | Konigorski | |
| 8,002,216 B2 * | 8/2011 | Decker | 244/58 |
| 8,485,465 B2 * | 7/2013 | Lee | 244/30 |
| 8,777,156 B2 * | 7/2014 | Piini et al. | 244/94 |
| 8,931,739 B1 * | 1/2015 | Lutke et al. | 244/123.11 |
| 2002/0179771 A1 * | 12/2002 | Senepart | 244/97 |
| 2004/0248496 A1 * | 12/2004 | Harvey | 446/61 |
| 2005/0236519 A1 * | 10/2005 | Handley | 244/97 |
| 2005/0258306 A1 * | 11/2005 | Barocela et al. | 244/30 |
| 2006/0065777 A1 * | 3/2006 | Walden et al. | 244/97 |
| 2008/0011900 A1 * | 1/2008 | Quintana | B64B 1/30 244/30 |
| 2008/0048453 A1 * | 2/2008 | Amick | 290/44 |
| 2008/0087762 A1 * | 4/2008 | Holloman et al. | 244/30 |
| 2008/0179454 A1 | 7/2008 | Balakovic | |
| 2008/0185475 A1 * | 8/2008 | Fuller | 244/5 |
| 2008/0272233 A1 * | 11/2008 | Marlin | H02S 10/00 244/1 R |
| 2009/0065633 A9 * | 3/2009 | Luchsinger | 244/33 |
| 2009/0078818 A1 * | 3/2009 | Zulkowski et al. | 244/30 |
| 2009/0114768 A1 * | 5/2009 | Voorhees | 244/97 |
| 2009/0152391 A1 * | 6/2009 | McWhirk | 244/30 |
| 2009/0230237 A1 * | 9/2009 | Tillotson | 244/30 |
| 2009/0238741 A1 * | 9/2009 | Konigorski | 423/210 |
| 2010/0270424 A1 * | 10/2010 | DeLaurier | 244/25 |
| 2012/0248241 A1 * | 10/2012 | Goelet | 244/30 |

* cited by examiner

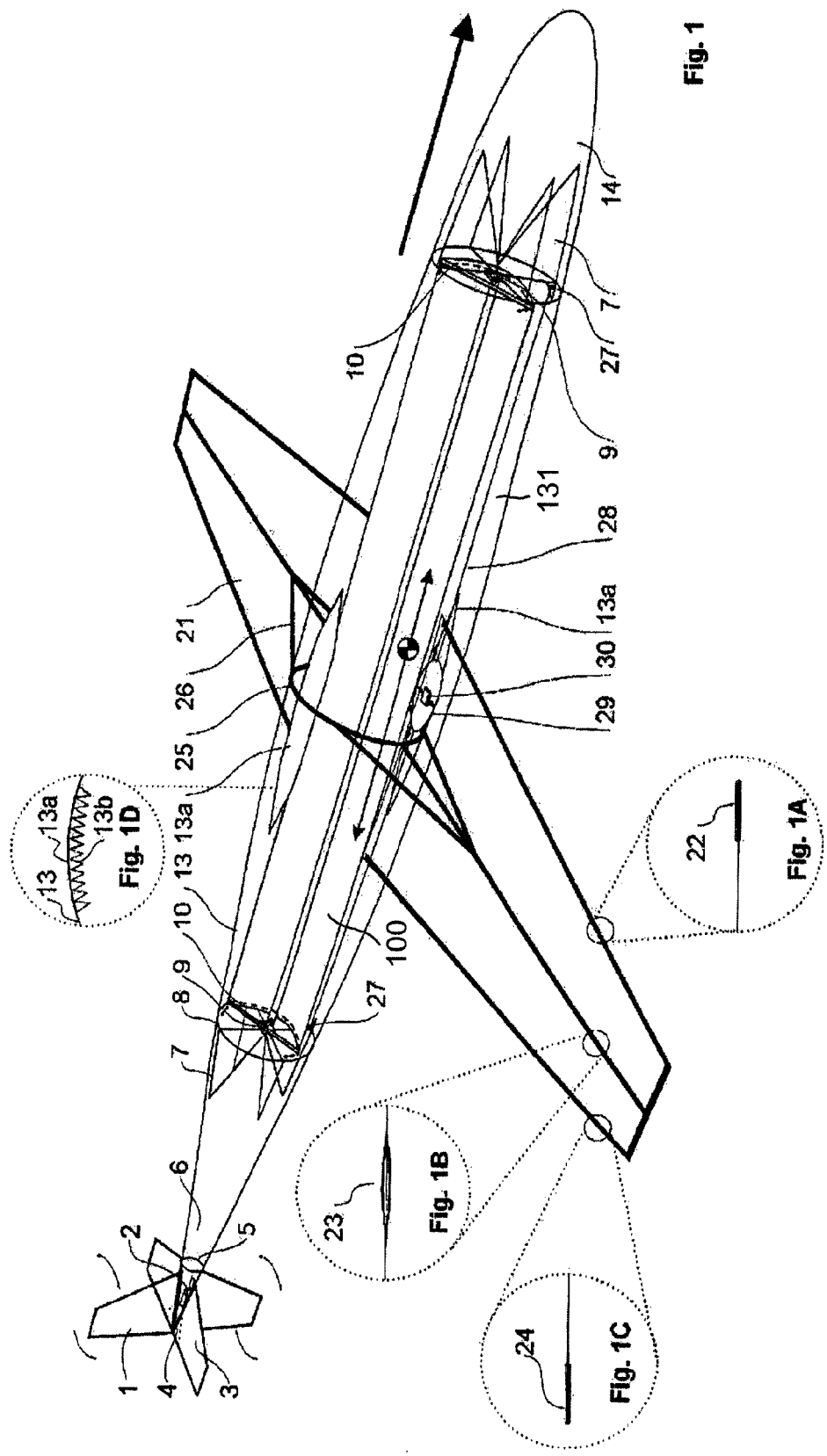

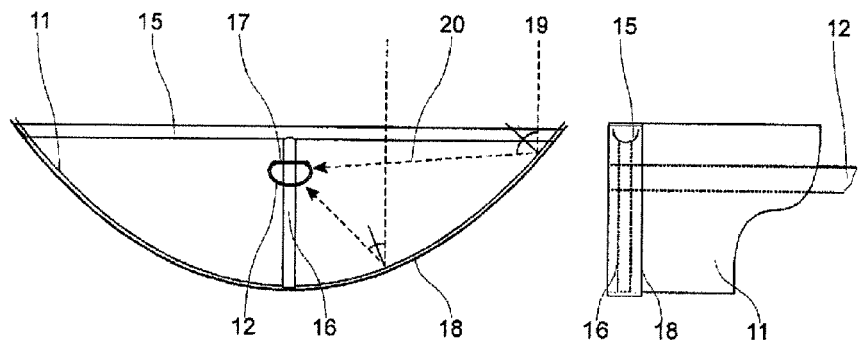
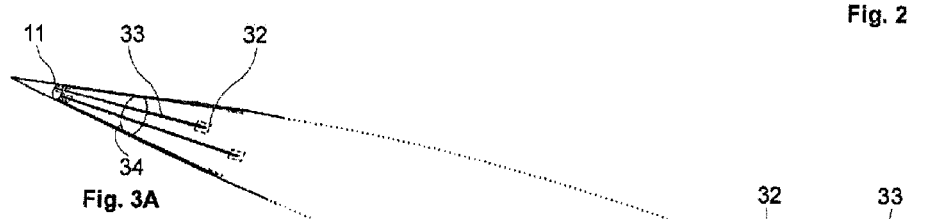
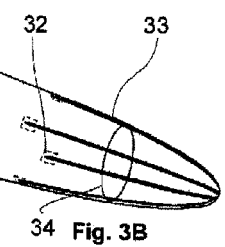
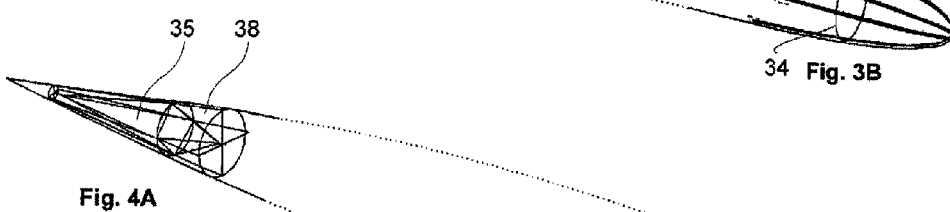
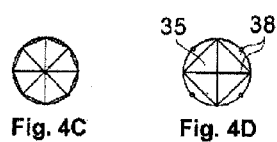
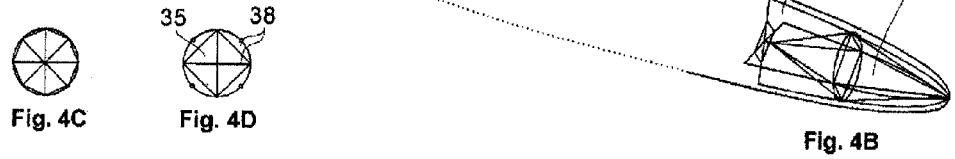
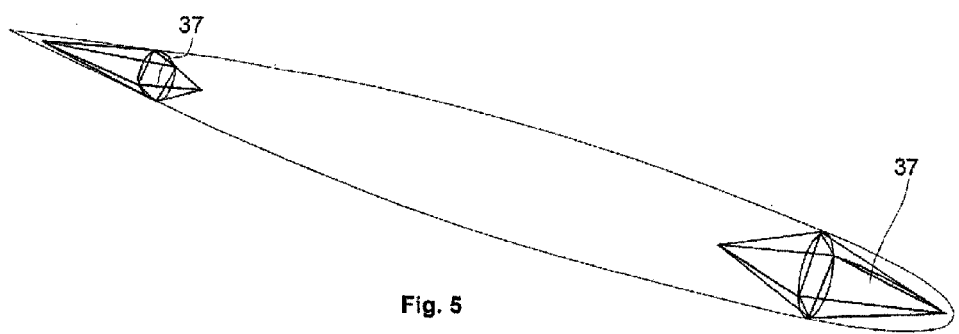

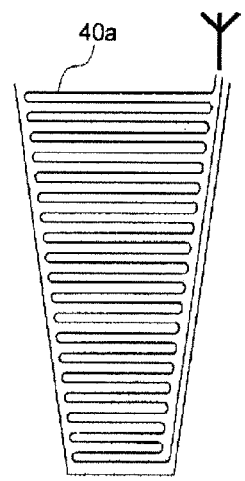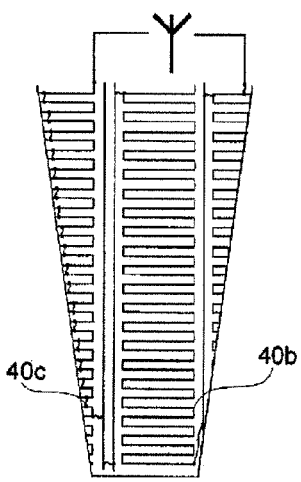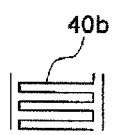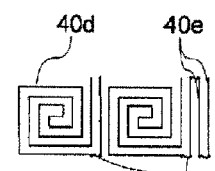
Fig. 6A     Fig. 6B     Fig. 6C     Fig. 6D
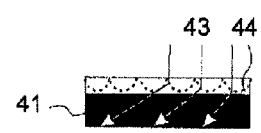
Fig. 7A     Fig. 7B     Fig. 7C
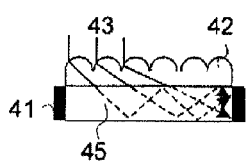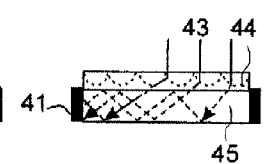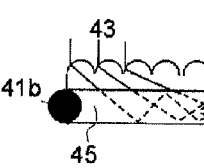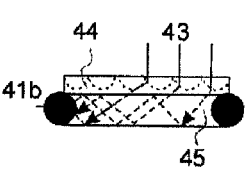
Fig. 8A     Fig. 8B     Fig. 8C     Fig. 8D
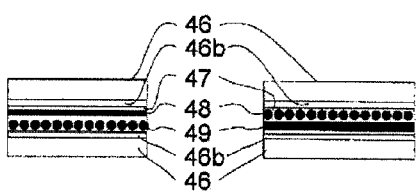
Fig. 9A     Fig. 9B

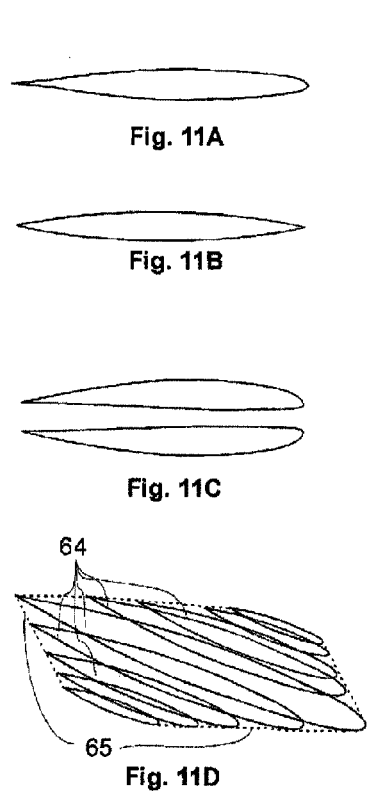
Fig. 11A
Fig. 11B
Fig. 11C
Fig. 11D
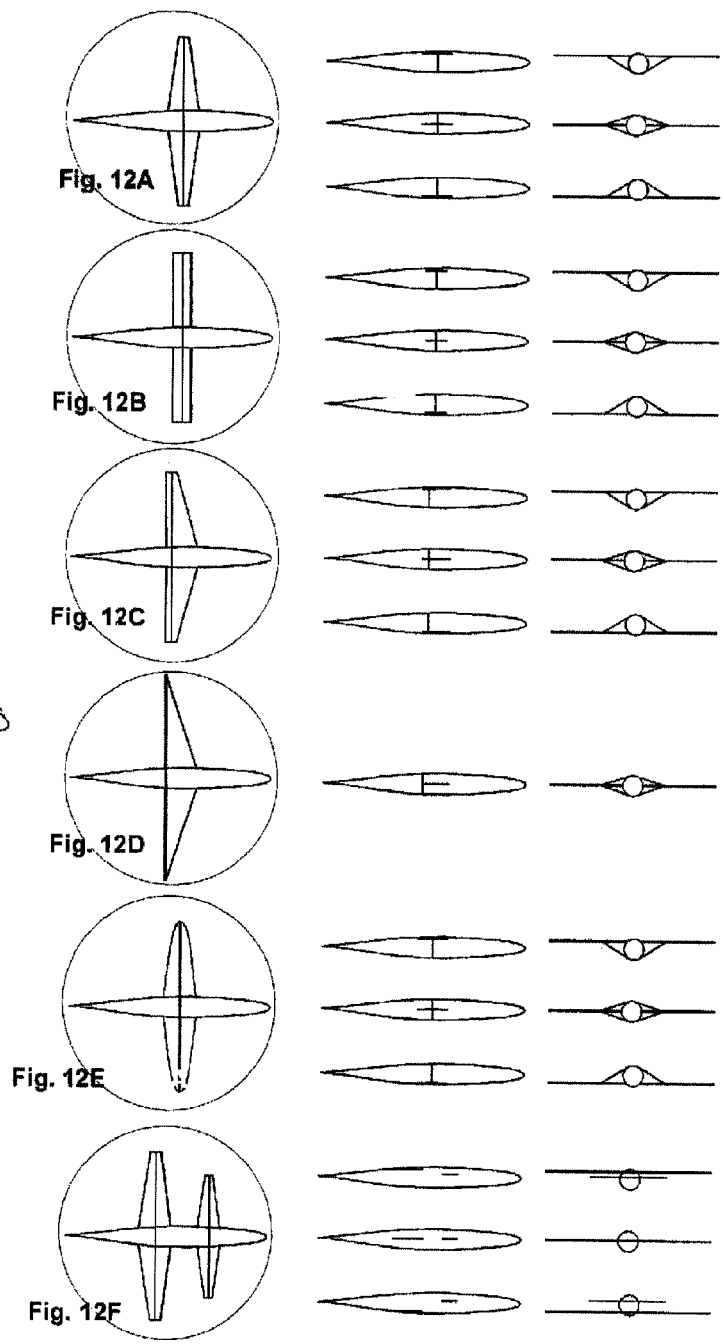
Fig. 12A
Fig. 12B
Fig. 12C
Fig. 12D
Fig. 12E
Fig. 12F
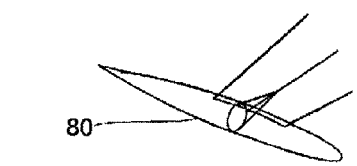
Fig. 13

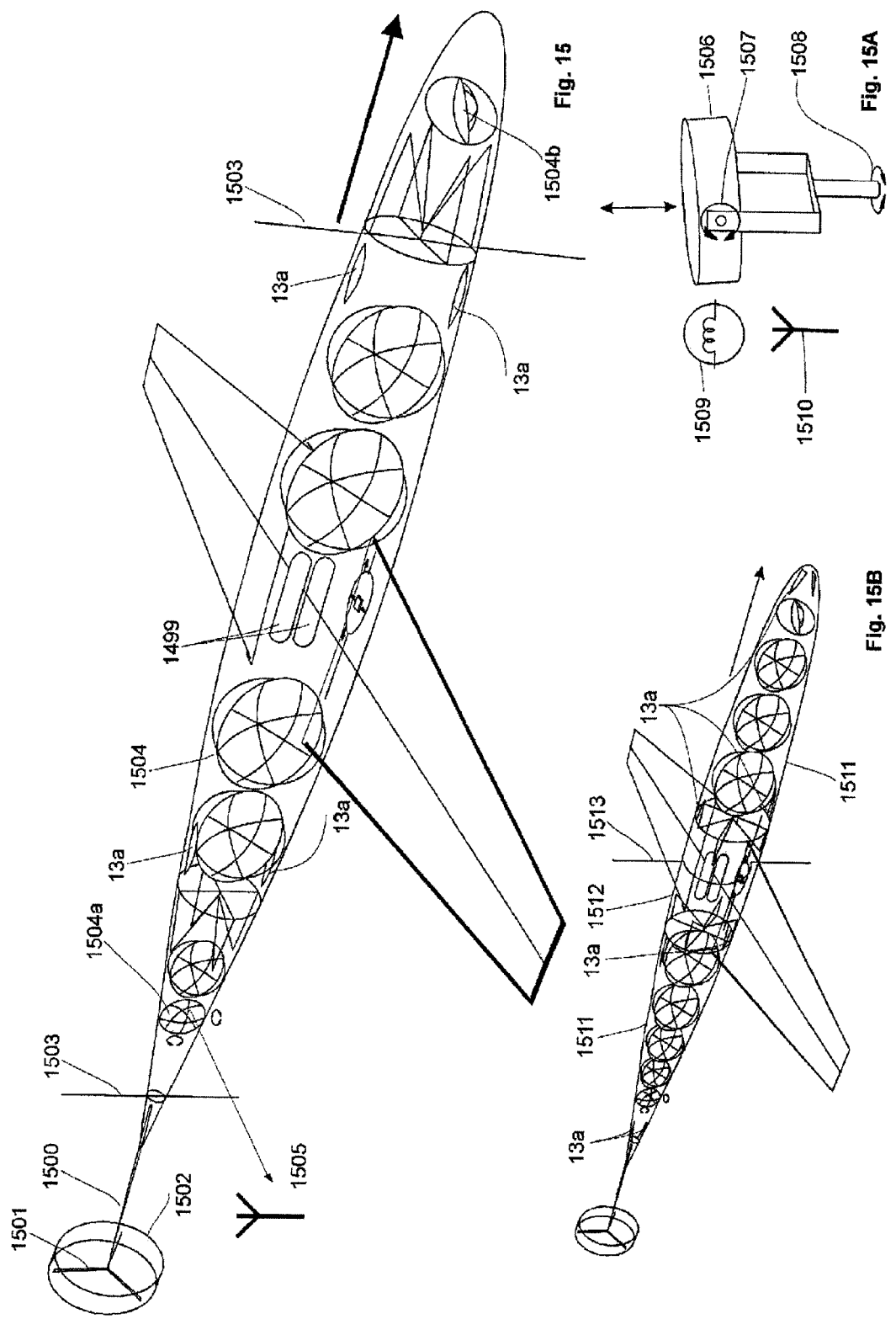

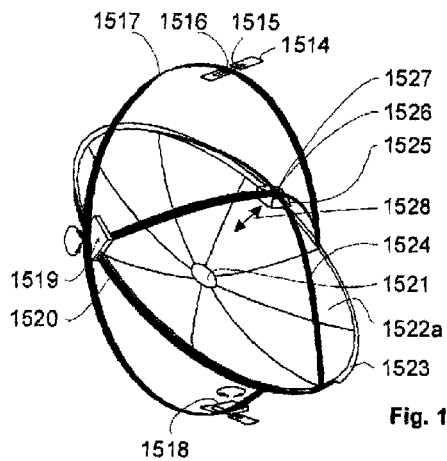
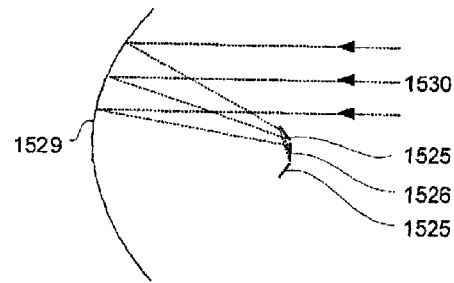
Fig. 15C    Fig. 15D
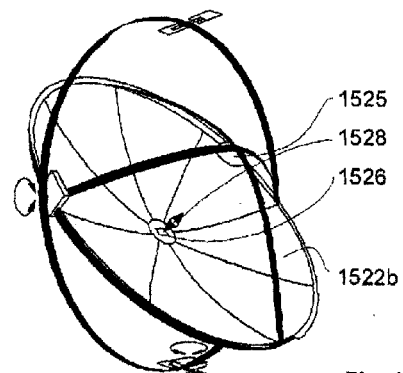
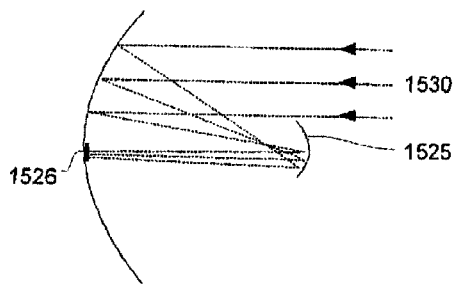
Fig. 15E    Fig. 15F
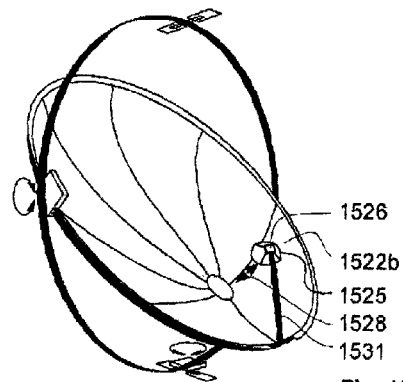
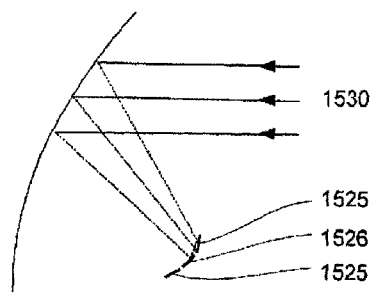
Fig. 15G    Fig. 15H

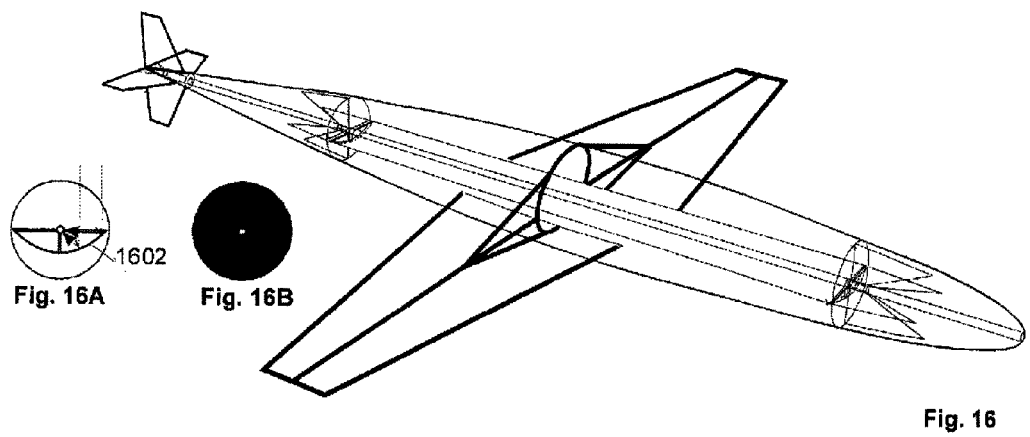
Fig. 16A
Fig. 16B
Fig. 16
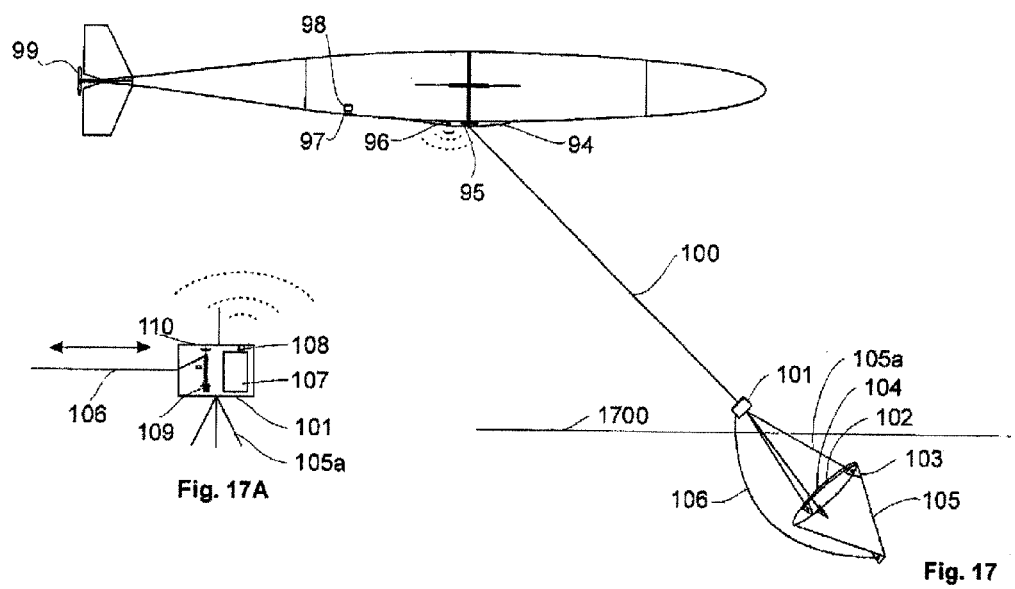
Fig. 17A
Fig. 17
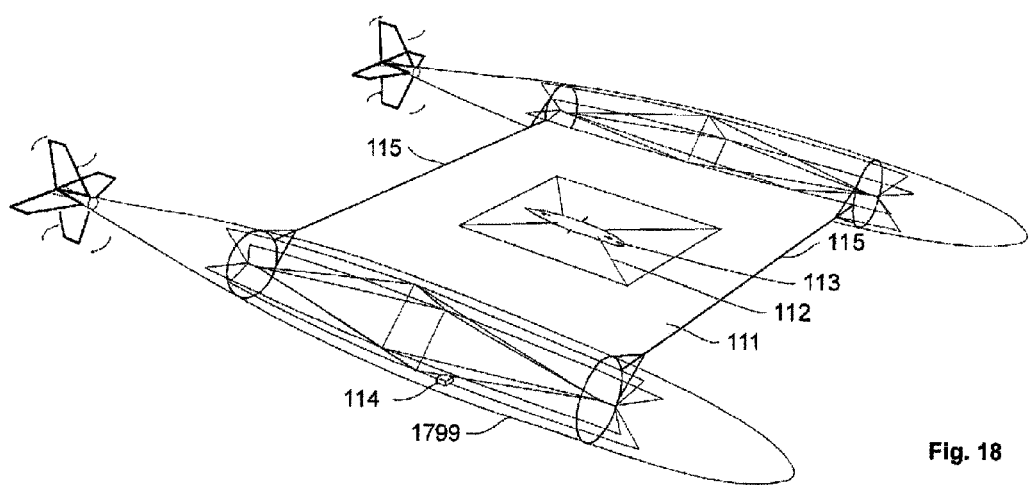
Fig. 18

AERIAL VEHICLE AND METHOD OF FLIGHT

This application is a continuation of U.S. patent application Ser. No. 13/636,583, filed Nov. 29, 2012, which is the U.S. national phase of International Application No. PCT/GB2011/050562, filed in English on Mar. 22, 2011, which designated the U.S. and claims priority of GB 1004803.1, filed Mar. 23, 2010, the entire contents of each of which are herein incorporated by reference in this application.

The present application relates to an aerial vehicle. More particularly it relates to an aerial vehicle and method of flight in which the vehicle is propelled by altering the buoyancy of the vehicle and using the resulting rising and falling motion to produce a horizontal motion component.

Aerial vehicles require some means to maintain their altitude. At a basic level aerial vehicles can be considered as those that are lighter than air and those that are heavier than air. An example of a lighter than air vehicle is a blimp, which maintains its altitude by buoyancy. An example of a heavier than air vehicle is a glider, which gains altitude on thermals and then glides down to lower altitudes using air speed to generate lift from the passage of air over its wings and control surfaces.

Unlike powered flight, where fuel must be expended to generate lift, both blimps and gliders can maintain altitude for reasonably long periods because no fuel is expended to maintain lift. Nevertheless, the time that they can spend airborne is still limited. A glider must find a source of lift such as a thermal, otherwise it will eventually glide down to the ground. Blimps are maintained in the air by the buoyancy of a lighter than air gas, such as helium, in an envelope. Over time the lighter than air gas will escape from the envelope and the blimp must land to refill the envelope or refuel to propel the vehicle through wind.

Recently there has been a desire to develop aerial vehicles that can remain airborne for long periods: several days and longer. Such vehicles are useful for gathering reconnaissance and relaying communications. Conventional aircraft are not suitable for remaining airborne for several days. A glider cannot remain airborne long enough to be useful. A blimp has limited longevity in such applications because the lighter than air gas in its envelope will gradually escape. The blimp must also be driven by a propeller to maintain position against winds and air currents and the required energy and supply of fuel limits the time a position can be maintained, even if the blimp is still airborne. Although blimps may be tethered in position this requires access to the ground under the reconnaissance position, something which may not be possible.

Specialist vehicles that can remain airborne for up to three days are known. For example, QinetiQ has demonstrated the Zephyr aircraft. The Zephyr is a lightweight, heavier than air, powered aircraft that uses solar cells on its wings to charge a rechargeable battery. The Zephyr flies using the thrust from propellers powered by the battery and the resulting aerodynamic lift from its wings as it moves through the air. In tests, the Zephyr has demonstrated a continuous unmanned flight of two weeks.

The length of time the Zephyr can remain airborne is determined by the energy budget—the energy required to power the propellers to maintain altitude and position versus the energy generated by the solar cells. To minimize the energy required to maintain altitude and position, the Zephyr moves at relatively slow speeds. To minimize drag the solar cells are mounted on the surface of the wing. However, this introduces a disadvantage because they may not be orientated in the optimum position towards the sun to gather the most incident sunlight.

Buoyancy propelled sea vehicles are known. These include the Seaglider developed by the University of Washington, the SLOCUM glider developed by the University of Princeton and the Spray glider developed with support from the U.S. office of Naval Research. These vehicles are propelled by changes in their buoyancy causing them to be alternately heavier than the surrounding water and sinking or lighter than the surrounding water and rising.

The density change cycle is powered by the thermal gradient between deep water and surface water, in other words it is indirectly powered by the energy input of the sun warming the surface water. Buoyancy powered sea vehicles can remain in use for many months, essentially limited by the electrical supply for their sensors and navigation systems. Existing sea buoyancy powered sea vehicles cannot easily be adapted for use in air. Atmospheric air does not demonstrate the same temperature gradient (it is colder rather than warmer at altitude). There are other problems too, the increased density of water compared with air means the overall density of the craft can be much higher for use in water than is needed for use in air. Known sea vehicles using buoyancy propulsion may have a mass as high as 50 kg. This helps them to be less effected by ocean currents than the effect of atmospheric winds on a lighter than air aerial vehicle. The vehicles also move slowly, with a horizontal speed of 0.4 m/s, limiting their ability to traverse distances quickly.

A buoyancy propelled aerial vehicle is discussed in WO-A-2005/007506 (Hunt). Hunt proposes to change an aircraft's density by a phase change technique, changing a gas into a liquid state and vice versa. However, Hunt's aircraft proposes to generate the power for this phase change using wind turbines. Although he discusses that the wind turbines can be used to store energy while the vehicle is on the ground, once the vehicle is in flight no additional energy can be input to the system because the energy to drive the wind turbines comes from the gravitationally driven motion of the craft. The endurance is determined by the stored energy from the turbines before the craft takes off. In flight it is impossible for the gravitational cycle to generate enough energy to power further gravitational cycles indefinitely without an external input of energy, otherwise the vehicle would be a perpetual motion machine.

It would be desirable to overcome at least one of the disadvantages with existing aerial vehicles. Accordingly, the present invention provides an aerial vehicle which is propelled by changing its buoyancy by compressing atmospheric air into a compartment of the vehicle. The compressed air acts as ballast so that the vehicle is either heavier than air and falling or lighter than air and rising when compressed air is expelled. As it rises and falls a control mechanism is actuated to create a horizontal component to the motion, for example through a wing or flight surfaces. As is discussed below such a method can produce surprising horizontal speed in air and can be more energy efficient than generating thrust with a propeller, enabling a longer time in the air.

According to the present invention, there is provided an aerial vehicle comprising:
 a first compartment for holding a lighter than air gas;
 a second compartment for holding atmospheric air and having an inlet and an outlet;
 a solar panel for converting sunlight into electricity;

a compressor for pumping atmospheric air through the inlet into the second compartment;

control means for controlling the pitch and yaw of the vehicle; and a controller for controlling the buoyancy of the vehicle via the compressor and the outlet such that the vehicle is either lighter than the surrounding air and rising or heavier than the surrounding air and falling, and for controlling the control means such that the rising and falling motion includes a horizontal component.

The first compartment filled with lighter than air gas enables the vehicle to have an overall weight lighter than the surrounding air (in other words the vehicle weighs less than the volume of air it displaces). It has been found that for use in air relatively small changes in the weight of the vehicle can alter its balance between being lighter than air or heavier than air. Thus, the buoyancy of the vehicle can be controlled simply by compressing air into the second compartment. This is simpler and requires less energy than the phase change technique proposed by Hunt. The external energy to alter the buoyancy is provided by an external source, the solar panel. If it is desired for the vehicle to operate during the night when the sun is not available, batteries may be included to store the energy for use at night.

Preferably the horizontal component of the rising and falling motion is greater than the vertical component. The horizontal component may be sufficiently large that the overall motion of the vehicle is substantially horizontal.

The first and second compartments may be any envelope suitable for retaining a gas. The solar panel may be any arrangement suitable for generating electricity from incident sunlight. Preferably, a solar cell such as photovoltaic cell is used but other solar energy systems may also be used including the photoelectric effect and solar furnaces. The compressor may be any pump suitable for compressing air, for example it may comprise an air pump driven by an electric motor. The control means can be any suitable control system for controlling the pitch, roll and yaw of the vehicle, some non-limiting examples are discussed later in this specification.

The controller may be a microprocessor, microcontroller, field programmable gate array, application specific integrated circuit, or any other suitable device. The controller preferably includes interfaces for sensors to allow control of the aircraft, for example including a position sensor, attitude sensor, compass, pressure sensors, infrared and/or further sensors. IR sensors can be orientated in the XYZ axes to determine the orientation using the property that the IR reading is generally warmer towards the ground than the sky.

It has been found that the efficiency of an aerial vehicle according to the invention is improved, compared with conventional methods of propulsion such as a propeller. For example, the vehicle may experience a free lift force of around 7N/s at sea level launch reducing to 4N/s at the bottom of a typical operating altitude range (1 km). The force continues to reduce with altitude up to a buoyancy ceiling, for example 3.5 km. The vehicle may take typically take 10 minutes to ascend from 1 km to 3 km. The controller then activates the compressor and air ballast gradually builds up in the second compartment. For example, this may result in a constant force of up to 4N arising from gravity during a gliding descent for a further 10 minutes. When ballast is expelled a constant freelift force of 4N applies in gliding ascent. The force reduces over a further 10 mins as the vehicle approaches its buoyancy ceiling, typically providing 2400N/s of force over this cycle (averaging 2N). Although the forces are small, the force can be harnessed to result in unexpectedly fast horizontal motion.

To give an example, an electric motor may power an air pump to draw in and compress atmospheric air to create ballast. If the air pump were to drive a propeller an air speed of around 15 kms/hr would result. However, with this arrangement an airspeed of around 50 kms/hr may be realized (75 kms/hr at a gliding ascent of 16° ascent, 21° gliding descent) and energy is only consumed for around half the cycle (around 100 watts while the motor is in operation to compress air to give ballast for the descent). This gives sufficient ground speed to penetrate wind (other than the most extreme winds) to maintain a loitering position over an operating station.

A preferred operating altitude range is 1-3 km. This operating altitude range may be significantly higher in some embodiments. The vehicle may also operate at a higher operating range by launching the first compartment semi inflated. As the density changes, the envelope will become fully inflated at the required lower operating altitude. A larger first compartment may also be used. The vehicle may utilize jet-streams at around 10 kms-14 ms altitude to traverse distances more quickly if the wind offers a useful vector, or alternatively it can circle to utilize thermals as well as using also ridge lift or wave lift.

In another aspect of the invention, an aerial vehicle is provided which comprises:

a first compartment for holding a lighter than air gas;

a second compartment for holding atmospheric air and having an inlet and an outlet;

an engine;

a fuel tank for storing fuel for use by the engine;

a compressor for pumping atmospheric air through the inlet into the second compartment;

control means for controlling the pitch and yaw of the vehicle; and a controller for controlling the buoyancy of the vehicle via the compressor and the outlet such that the vehicle is either lighter than the surrounding air and rising or heavier than the surrounding air and falling, and for controlling the control means such that the rising and falling motion includes a horizontal component.

The construction of this aspect is therefore the same the first aspect, except that the solar panel is replaced with an engine and fuel tank. It has been found that the high efficiency of buoyancy propulsion can be advantageous when the vehicle is provided with a conventional engine and fuel source. This may allow carrying of heavier loads than with a solar panel. A buoyancy propelled aerial vehicle consumes less fuel compared with a lighter than air blimp or fixed wing aircraft propelled forwards by a propeller. For example, the buoyancy aerial vehicle may be scaled to carry an ISO container.

In both of the above aspects, the aerial vehicle preferably creates substantially no aerodynamic lift at a zero degree angle of attack. Ideally, the airframe of the vehicle as a whole has a coefficient of lift which is between approximately −0.01 and 0.01 based on planform reference area.

The control means may be further for controlling the roll of the vehicle.

The aerial vehicle may further comprise a nacelle, and wherein the first compartment and the second compartment are both contained within the nacelle. A nacelle is a streamlined enclosure that enables the drag of the vehicle to be reduced by housing components inside the nacelle. As the forces involved are relatively small, reducing drag can have a significant effect on the performance of the vehicle.

Preferably, the nacelle has an outer surface which defines a body of revolution or an airfoil. Although the nacelle may have the shape of an airfoil, it has been found that, surprisingly, the performance may be improved if the nacelle is shaped such that no (or minimal) aerodynamic lift is generated at a zero angle of attack. A conventional asymmetrical airfoil commonly used for a wing, will create vortex induced drag as a result of generating aerodynamic lift. The induced drag is significant and will significantly slow the vehicle. The aerodynamic lift from the airfoil is not required in a vehicle according to the present invention, its lift is generated by the buoyancy of the lighter than air gas in the first compartment. If an asymmetrical airfoil is used, performance may be improved by orientating the airfoil such that it generates a downward force, rather than a conventional upward, lift force in gliding ascent.

It will be appreciated that all the components of the vehicle, apart from the control surface, could be situated inside the nacelle, or inside additional nacelles, to further reduce the drag on the vehicle. In embodiments including a solar panel, it is particularly advantageous if the nacelle is transparent and the solar panel is contained within the nacelle. This enables the solar panel to be oriented more efficiently towards the sun, without increasing drag.

The efficiency of the solar panel can be further improved in one embodiment by providing a parabolic mirror associated with the solar panel for focussing sunlight onto the solar panel. This has several advantages. A mirror can weigh less than a solar panel, allowing more sunlight to be gathered for less weight. The cost of providing the mirror is also likely to be less than the cost of solar panels of equivalent area. This embodiment is particularly effective when the solar panel and mirror are contained within a transparent nacelle because then the mirror has no effect on the drag. Any suitable mirrored film can be used for the parabolic mirror, preferably one that is UV stabilized. In one embodiment 3M Vikuiti Reflection Film, commercially available from Optical Systems, 3M, 3M Center, St. Paul, Minn. 55144-1000 USA is used. It may be manufactured to the required thickness, preferably around 10 μm, and provided with a UV stabilized antireflective coating. This has a reflectance of 95%.

The aerial vehicle may further comprise an electric motor for changing the orientation of the solar panel and/or the parabolic mirror relative to the vehicle. This allows the solar panel to track the sun through the sky for improved efficiency and is particularly advantageous when the solar panel is inside a transparent nacelle because it then has no effect on drag. Preferably, the orientation may be altered along an axis running from the front to the back of the vehicle. The mirror and/or solar panel may be constructed to have constant distribution of weight about this axis, so that changing orientation does not alter the weight distribution of the vehicle. Alternatively, any change in weight distribution may be compensated through the control surface or by moving internal components to change the centre of gravity/buoyancy. The tracking can be implemented simply by monitoring the output of the solar panel, by using a light sensor or alternatively by knowledge of the position of the sun to calculate optimum orientation.

In another embodiment, the solar panels may comprise one or more parabolic dishes, held within the first or second chambers. The one or more parabolic dishes are preferably orientated into sun light around two rotational axes. The one or more parabolic dishes may be made of a restraining ring, which is preferably made of carbon fiber, with mirror film sections that are bonded together to form a parabolic dish. The shape of the parabolic dish is retained due to the restraining ring. In this embodiment, light is reflected by the mirror film and focuses into a small photovoltaic cell. Ideally, the cell is a triple junction cell with a Indium Gallium Phosphide (InGaP) junction, Indium Gallium Arsenide (InGaAs) junction and Germanium (Ge) junction on a substrate Germanium (Ge). Cells of this type are available from Emcore Corporation, Albuquerque, USA. Alternatively a four junction cell of GaInNAs, Cu(In,Ga)Se2 Heterojunction cell, or any other photovoltaic solar cell may be used.

The solar panel may comprise Gold Nano Cups latex substrate that is available from Rice University of Texas. This is created using a glass substrate and evaporating gold onto nano balls, then applying an elastizer such as latex. When the latex is removed nano plano-concaved lens are formed on the latex substrate (they are all aligned), so that random incidental light, is then made parallel in a single direction after passing through the latex. Alternatively, latex may be used as a 'former' and if a resin is applied and the latex 'former' removed, nano plano-convex lens may be present on the resin film (with better optical qualities). Most light passes through a Photo Voltaic (PV) cell without generating electrical energy, so use of such a film would bend light along the length of the PV film, increasing the path of a photon as it passed through the PV material. This increases the likelihood of the photon hitting an electron out of orbit to generate additional electrical power. The nano plano-convex film may be added to any PV cell, although it is preferred that the PV cell is on a plastic substrate. NanoSolar of the USA has a demonstrated efficiency of 14.6% commercially available on an aluminum substrate. Alternatively, a metal backed PV film, such as steel, may be used or a polymer substrate. Likewise any PV cell maybe employed.

Additional power may be generated in some embodiments by a Thermal Electrical Generator (TEG). A metal foil section is bonded into skin of the first and or second compartment or the outer surfaces of the aerial vehicle. Preferably, the metal foil is a TEG metal foil, ideally, bismuth telluride with P-N junctions or any material in the class of Thermal Electrical Generators or alternatively the TEG is attached to a metal foil such as silver, gold, copper or aluminum. Waste heat from the solar cells is lost to the interior of the first and/or second compartments through convection. The TEG forms part of the chamber (that is heated through sunlight) and also exposed to colder atmospheric air outside, the heat differential across the TEG creates electrical energy that may be used to improve overall efficiency of the aerial vehicle. A heat sink may be attached to the innermost section of the TEG to improve thermal conductivity. Preferably the heat sink is an aluminum honeycomb with high surface area to weight.

In an alternative embodiment, the heat differential between the solar cells (first and/or second compartments) and the external atmosphere may drive a Sterling or Rankine cycle engine to create additional energy that may either drive the pump directly or a dynamo to produce additional power. The solar cells may be thermally connected through a heat conductive flexible wire (preferably silver wire or carbon filament) or flexible heat pipe to the TEG or a metal foil section on the chamber or outer surfaces (across the Sterling or Rankine engine).

In another embodiment, the aerial vehicle further comprises at least one wing. It is preferred that the wing is substantially flat so it generates as little drag as possible. Aerodynamic lift is not required to be generated by the wing other than to maintain a glide path, it is instead provided to assist in generation of a horizontal component from the vertical buoyancy driven motion. The wing is a 'flat plate' film wing, with minimal frontal area exposed to the air it penetrates. It is maintained by a slim symmetrical carbon fiber airfoil section running the length of the wing. A carbon fiber wingtip section maintains rigidity across the wing. The film may be sandwiched between two carbon fiber parts.

In alternate embodiments the wing may be a substantially symmetrical airfoil in cross section. In further alternate embodiments the wing may be an asymmetric airfoil in cross section. In the case of an asymmetric airfoil, preferably substantially no aerodynamic lift is generated at a zero angle of attack. Preferably, the asymmetric airfoil may have a lift coefficient between approximately −0.01 and 0.01 (based on a planform reference area)

In embodiments where the wings are a symmetrical airfoil section, they are preferably machined of foam with supporting carbon fiber parts along the leading and trailing edges and covered with a heat shrunk film (such as polyester). The ideal thickness of the wing chord is 3.5% of height to chord length.

In embodiments including a solar panel, the at least one wing may comprise the solar panel. For example, a flexible solar panel may be installed within the wing. In a further embodiment, one or more actuated parabolic troughs may be installed within the aperture sections of the wing. The parabolic trough is preferably made from mirror film that is held in place at each end with a parabolic section of carbon fiber that is actuated to orientated the panel into sunlight. The panels may be actuated individually or together using coupled gears (for example by using a timing belt).

Depending on the size of the aerial vehicle, the parabolic trough may be relatively small in size. In some embodiments conventional cells would be too large and in that case a solar cell wire may be used at the focal point. The wire is preferably made of Germanium with coated layers and a contact for each coated layer. More preferably triple coatings are used of Indium Gallium Phosphide (InGaP), Indium Gallium Arsenide (InGaAs) and Germanium (Ge) onto a wire or tube substrate (that may be Germanium). Coatings may be applied by vapor deposition or any industrial process that may form a metal coating onto the base material. Any coatings layers and substrates known in the class of photovoltaics may also be used. Unlike conventional solar cells, in these embodiments the photovoltaic is applied onto a wire or tubular core material, for example by using a roller to roller manufacturing technique. The tubular arrangement of a solar cell wire has the advantage that a working fluid may be used to draw heat away from the solar cell. The working fluid may be used in a sealed heat pipe arrangement to more effectively draw heat away from the solar cell (so it operates at higher thermal efficiency). Preferably a deep parabolic trough is used and the focal point is within the trough (or largely in the centre section) where the solar cell wire is positioned, so that light is reflected onto all parts of the wire.

In an alternative embodiment, the PV cell may be incorporated onto the surface of the vehicle other than on the surface of a wing.

In one embodiment, the nacelle is an airfoil with a ratio of thickness to chord length between approximately 5% and approximately 35%. This gives a significantly more elongated structure than a conventional blimp, when the first compartment is incorporated into the nacelle. It has been found that this reduces drag, improving performance.

The first compartment has to withstand relatively low pressures, preferably around 0.3 atm. It may therefore be formed from any suitable film. However, the time that a vehicle can remain airborne according to the present invention is limited by the rate at which gas is lost from the first compartment, because this will reduce the buoyancy. The film may not be effective at preventing the loss of gas through it. Preferably, the wall of the first compartment comprises a barrier layer for limiting loss of the lighter than air gas through the wall of the compartment. Examples of suitable barrier layers include EVAL which is commercially available from Kuraray Co. Ltd. (EVOH), PvdC or PVOH and are encapsulated between a polymer as the barrier is affected by water ingress. HOSTAPHAN® RHBY barrier is commercially available from Mitsubishi (SiOx) and is preferred because its barrier properties are unaffected by moisture and it is also optically clear. The barrier layer may be formed by evaporation onto a substrate in a vacuum chamber, which may be manufactured by Alcan of Switzerland, and an additional polymer laminated to the composite by sputtering adhesive to provide a protective layer. With such a barrier layer the vehicle may remain airborne for up to 239 days before the lift gas in the first department is depleted through loss to the atmosphere, resulting in a 50% loss of free lift.

The second compartment may have to withstand higher pressures than the first compartment. There may be a differential pressure of up to 2 atmospheres with the outside air. To withstand these pressures the second compartment is preferably made from a plastic film which can be ultrasonically or radio frequency welded. Examples include Acetal Co/Homopolymer, Acrylic, Acrylic—Impact modified, Acrylonitrile Butadiene Styrene, Cellulose Acetate . . . , Polyamide 6 & 66 (Nylon), Polycarbonate, Polycarbonate/ Abs, Polyester—Thermoplastic, Polyethylene—Low/High Density, Polyphenylene Oxide, Polyphenylene Sulphide, Polypropylene, Polystyrene—General Purpose, Polystyrene—High Impact, Polyvinyl Chloride—Flexible, and Styrene Acrylonitrile.

In an alternative embodiment the aerial vehicle further comprises a third compartment for holding a refrigerant which can undergo a reversible phase change from a gas into a liquid. The refrigerant may be a refrigerant gas. The third compartment may be located within the first or second chambers. As the second compartment is filled with atmospheric air (in some embodiments this may also displace the lighter-than-air gas held within the first chamber), the pressure will increase. The pressure change may then trigger a phase change in the refrigerant from a gas to a liquid that typically occupies approximately 0.1% of the volume of the gas. This allows the pump of the compressor to work within a lower overall pressure regime with higher flow rates, allowing more air ballast to be accumulated more quickly and improving the aerial vehicle's overall airspeed performance. Iso-butane, butane or other refrigeration gas may be used. The total volume of the third compartment is sufficient to accommodate this gas in its gaseous state, that the third compartment may be made of a flexible membrane such as latex or neoprene or a polymer film (previously described) that deflates when the refrigerant is in a liquid state. Preferably the refrigerate gas condenses to a liquid state at >1 and <4 ATM absolute pressure at around 0° C.

Joints on the second compartment maybe reinforced with a glass, plastic, Ultra High Molecular Weight Polyethelene filaments (such as that sold under the trade name Spectra or Dyneema), or carbon threads held in place with resin. The material used for the air ballast chamber may be a composite comprising a matrix held in a plastic laminate. In a preferable embodiment, Spectra or filament is used that may be reinforced with carbon fibers in an encapsulated matrix. This material is known for use in high performance sail clothing and may be supplied by Cubic Tech Corporation of Arizona, USA. It is sometimes referred to as Cuben Cloth.

In a further embodiment, the second compartment is a flexible membrane (latex rubber, neoprene or an elastic) or an inflatable chamber (of a film previously described) held within the first chamber, that may expand/contract or inflate to accommodate atmospheric air which is pumped into the second chamber, displacing the lift gas in the first chamber under pressure. This has the advantage to reduce the overall volume of the aircraft (reducing drag) and allows the pump of the compressor to work at a lower overall pressure range across the cycle. Where the first and second compartments share a common membrane or film to separate them an outer ring of carbon fiber is used to maintain the required aerodynamic shape of the overall envelope. In an alternative embodiment the second compartment may be separate from the first compartment.

The vehicle may further comprise at least one sensor for aerial reconnaissance or atmospheric monitoring. For example, the vehicle may include ISR sensors such as optical and IR cameras; Synthetic aperture RADAR, for example NanoSAR weighs approximately 900 g and is commercially available from IMSAR; an acoustic ranging and direction sensor, for example for detecting gunfire, that is commercially available from ROKE/BAE Systems, Thales or QinetiQ. The vehicle may also include jamming equipment.

The vehicle may also comprise at least one transmitter and at least one receiver for providing a wireless communications network. The transmitter and receiver could be combined in a transceiver. More than one transmitter or receiver may be provided to allow communication according to different protocols or for different purposes. In an advantageous embodiment, a lens can be used to adjust the Field of view (angle) of the transmitter and/or receiver (that can be the parabolic mirror described and the photovoltaic cell may also be the radio receiver). A standard optical lens, such as is used in a camera, is suitable and the antenna of the transmitter or received is mounted behind it. This can either provide a narrow field of view to point at another receiver for point to point networking at very high speed (for example speeds of 100 Megabits or greater) or provide a wide angle to provide multipoint to point networking. To give an example, 15 aerial vehicles could provide a Wi-Fi network covering the whole of greater London. In this application modest altitude of around 1 km or higher gives line-of-sight between network nodes that are preferably placed in a honeycomb formation. The network may be augmented with surface based radio repeaters to improve the overall bandwidth across the network.

The at least one transmitter can be used to transmit any form of data including reconnaissance data, meterological data, GPS signals, identification of ocean going vessel and position over Automated Identification System (AIS), radio data and television data.

In embodiments including a solar panel, the at least one receiver may comprise the solar panel. The solar panel can function effectively as a component of the receiver, reducing the overall component count of the aerial vehicle and reducing weight.

The at least one receiver may comprise an antenna formed by a metallised track having an undulating or snake-like pattern. Preferably the undulation is regular, in some embodiments is could be sinusoidal but a square wave based undulation is preferred. The distance between tracks of undulations is preferably chosen to be a multiple of the radio wavelength desired to be received by the receiver, to improve the antenna performance.

In another embodiment, the control means may comprise a member extending from the rear of the vehicle and an articulated connection between the member and the rear of the vehicle. The articulated connection enables the member to be angled relative to the body of vehicle, and preferably angled to the axis of the nacelle if one is present. The member is preferably generally cylindrical or rod-like to minimize drag. Surprisingly, such a member can provide a sufficient force to control the vehicle. The member may also be configured for rotation relative to the body, preferably about the axis of the nacelle if one is present. Such a control member can be used to control just yaw, or all of roll, pitch and yaw. A tube or paddle may be added to the end of the member, to increase the deflection into airflow (moment) to orientated the vehicle.

In alternate embodiments pitch may be controlled moving internal masses such as any batteries or pump that may be present, forward and aft or perpendicular to the main axis to achieve roll control. Rotational refinement (yaw) may also be achieved by spinning components, such as the batteries, if they are provided. Conventional control surfaces, such as a rudder and ailerons and elevators can also be used in alternate embodiments.

In some embodiments the control means may comprise a movable mass. Control of the pitch of the aerial vehicle may then be achieved by translation of the mass from front to back. Roll may be controlled by translation of the mass from side to side. Yaw may be controlled by spinning the mass around an axis. Depending on the other control means provided, some or all of the control methods using a movable mass may be implemented.

Embodiments which include a solar panel may form part of an aerial vehicle system which further comprises an electromagnetic radiation source for emitting electromagnetic radiation for reception by the solar panel. The electromagnetic radiation source is located remote from the aerial vehicle, for example at a fixed or mobile location on the ground or sea. The electromagnetic radiation may be in the visible spectrum, or may be outside of the visible spectrum, for example in the range 0.01 to 400 nm or 700 to 3000 nm. The electromagnetic radiation source may be a coherent electromagnetic radiation source, such as laser. In some embodiments the electromagnetic radiation source has a focal point which is the aerial vehicle and the aerial vehicle further comprises means for focusing incident electromagnetic radiation. The means for defocusing may be a lens or mirror.

For example, in some embodiments, surfaced based lights may form part of the air vehicle system. One or more surfaced based lights may be directed towards the air vehicle when there is less sunlight available (for example during winter or when in operating at very northerly or southerly latitudes). This provides additional power to the solar panels than would otherwise be obtained by sunlight alone. Ideally, providing additional power before dusk. The surface based lights may be actuated to direct light towards the aerial vehicle, using actuators to orientated the light beam with two degrees of rotational freedom. The lights ideally use a parabolic reflector or lens to parallelize the light into a beam or shaft that focuses on the aerial vehicle. The light source may be a laser. The light may be within the visual wavelength spectrum (400-700 nanometers wavelength) or ideally outside the visual range (200-400 nanometers or 700-2000 nanometers). The surface based lights may be at a fixed land position, on a moving surface vehicle (4×4, ground vehicle or ocean going ship) or mounted on a buoy for oceanic operation. Lighting apparatus for this purpose is commercially available and actuation is achievable by those in the art. The aerial vehicle may transmits its location to the surface based lights. For fixed location the surface lighting position is known or, in the case of a moving surface station, position is obtained by a positioning system such as GPS. The direction from the surface lighting station to the aerial vehicle is calculated and the light orientated towards this bearing using actuators. The solar panels of the aerial vehicle are orientated downwards to this source of light and additional light energy harvested by the aerial vehicle. This would not be possible with conventional solar powered aircraft that incorporate top facing solar panels on a fixed wing.

The vehicle may further comprise an electrolyzer for electrolyzing water into hydrogen and oxygen. The electrolyzer will produce hydrogen that may replace any lighter than air gas lost from the first compartment. The hydrogen may also be used as a fuel. The water for use in the electrolyzer is preferably collected from atmospheric condensation when air is compressed, water will form in the secondary air ballast chamber and may be pumped to the electrolyzer with a micro liquid pump.

In a further embodiment, the vehicle further comprises a jet engine. Excess hydrogen produced by the electrolyzer may be stored to power the jet engine. This allows the vehicle to obtain a new position more quickly if required.

Some embodiments may include an outlet at the bottom of the first compartment. The outlet may be opened to release any air that is present in the first compartment as the vehicle ascends. More air will leave via the outlet than the lighter than air gas because the air is heavier than the gas.

According to another aspect of the invention, there is provided a method of flight for an aerial vehicle comprising a first compartment filled with a lighter than air gas and a second compartment for holding atmospheric air, the method comprising:

alternately compressing atmospheric air into the second compartment and then releasing the compressed atmospheric air from the second compartment, thereby altering the buoyancy of the unmanned aerial vehicle such that it is either heavier than air and falling or lighter than air and rising; and actuating at least one control means such that the rising and falling motion includes a horizontal component.

Unlike the phase change method proposed by Hunt in WO-A-2005/007506, it has been found that efficient flight can be achieved using compressed air as ballast to alter weight of the vehicle. Controlled flight can be maintained using a fuel or potentially indefinitely with an external energy source, such as solar power.

Embodiments of the invention will now be described with reference to the accompanying drawings in which:

FIG. 1 is a perspective view of a diagrammatic representation of an aerial vehicle according the present invention.

FIG. 1A is a detail of a leading edge wing arrangement of FIG. 1.

FIG. 1B is a detail of a mid section wing arrangement of FIG. 1.

FIG. 1C is a detail of a trailing edge wing arrangement of FIG. 1.

FIG. 1D is a detail of a Thermal Electrical Generator foil insert that may be used with the embodiment of FIG. 1.

FIG. 2 is a cross section and end view of a solar cell arrangement for use with the invention.

FIGS. 3A and 3B depict a diagrammatic representation of a reinforcing arrangement for use with the vehicle of FIG. 1.

FIGS. 4A and 4B depict a diagrammatic representation of an alternate ballast compartment for use with the vehicle of FIG. 1.

FIGS. 4C and 4D depict cross sections through the ballast compartments that can be used in the vehicle of FIG. 1.

FIG. 5 depicts a diagrammatic representation of an optional third compartment inserted with the ballast compartment.

FIGS. 6A, 6B, 6C and 6D are a plan views of a diagrammatic representation of embodiments of a wing with an integrated aerial for use with the vehicle of FIG. 1.

FIGS. 7A, 7B and 7C depict a diagrammatic representation of a cross section through a solar cell for use with the vehicle of FIG. 1.

FIGS. 8A, 8B, 8C and 8D depict a diagrammatic representation of a negative refraction index film for use with the vehicle of FIG. 1.

FIGS. 9A and 9B depicts a cross section through a film for use with a compartment of the vehicle of FIG. 1.

FIGS. 11A, 11B and 11C depict alternative profiles for the body of the aerial vehicle of FIG. 1. FIG. 11D depicts a diagrammatic representation of a blended fuselage and wing configuration.

FIGS. 12A, 12B, 12C, 12D, 12E and 12F depict plan views of the wing profiles that may be used in various embodiments of the invention.

FIG. 13 depicts an optional wing tip nacelle that may be used with the vehicle of FIG. 1.

FIGS. 15, 15A and 15B are conceptual diagrams depicting an alternative embodiment of the vehicle. FIG. 15A is a conceptual diagram of a lighting unit for use with FIG. 1 of the vehicle.

FIGS. 15C, 15E and 15G are conceptual diagrams of alternative embodiments of the parabolic solar harvesting apparatus.

FIGS. 15D, 15F and 15H are cross sections of alternative embodiments of parabolic mirrors.

FIG. 16 is a diagrammatic representation of an aerial vehicle according to a further embodiment of the invention.

FIGS. 16A and 16B depict cross sections through the solar cell arrangement and body section of the vehicle of FIG. 16, respectively.

FIGS. 17 and 17A is a diagrammatic representation of an aerial vehicle according to another embodiment of the invention.

FIG. 18 is a diagrammatic representation of an aerial vehicle according to a further embodiment of the invention.

Figure 10A:
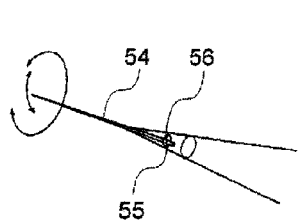
FIGS. 10A, 10B and 10C depict alternative embodiments of control surfaces that may be used with the vehicle of FIG. 1.

FIG. 1 is a diagrammatic representation of a perspective view of a first embodiment of the present invention. The first embodiment is an aerial vehicle, considering the vehicle from its rear to its front, it comprises a rudder 1 actuated by a servo 2. The rudder preferably comprises carbon fiber sheet with an aperture to reduce weight. Film is draped over frame and attached to the frame so that the film is taut. The rudder 1 comprises two parts: top and bottom. The top and bottom parts are attached with a rod. The rod forms the pivot point and is actuated with the servo 2. The pivot point is preferably placed at the centre of pressure so the arrangement is easy to turn with a very small servo.

The rear of the vehicle also comprises stabilizers 3. Preferably, the stabilizers 3 are static. However, in alternative embodiments, they may be actuated to function as elevators. In that case the area 4 marked with a dashed line may be removed to allow them to move and avoid interference with the rudder.

The rear section of the vehicle, supporting the rudder 1 and stabilizers 3, comprises a cone 5. It is preferably a carbon fiber cone with a cap. The cone houses a processor to function as the autopilot and the autopilot sensors (discussed in more detail below). An envelope film 13 interfaces with the cone and is held in place with resin and glass/carbon fiber fabric reinforcement.

Moving forward from the cone 5, the vehicle comprises a rear ballast chamber or compartment 6. This is made from either plastic film or reinforced film. Preferably, a plastic film sandwich is used comprising Ultra high molecular weight polyethylene (UHMWP) or UHMWP filaments (such as those sold under the trade names Spectra or Dyneema). If a filament is used, it is not woven as this would allow stretch, potentially altering the external surface shape of the compartment. Alternatively, other thread materials maybe added to form a matrix (e.g. glass or carbon fiber) and may be layered in different orientations for strength in more than one direction.

Extending into the rear ballast compartment are strengthening sections 7. These are provided to maintain the shape of the interface with the adjacent compartment 131 when the rear compartment 6 is under pressure. The strengthening sections 7 may be a UHMWP composite. A divider 8 maintains separation between the rear ballast compartment 6 and the adjacent compartment 131. It may also be formed of a carbon or UHMWP composite.

The adjacent compartment 131 is defined by envelope film 13 and is filled with a lighter than air gas to provide lift to the vehicle. Within the envelope is contained a servo 9 to rotate a solar cell arrangement such that the solar cell arrangement is preferably oriented towards the sun. Electrical power can be transferred to the servo through a slip ring and carbon brushes on the servo connection shaft.

A solar cell 100 is mounted within envelope 13 and can also be seen in cross section in FIG. 2. It comprises an end frame 10, a parabolic strip 18, a half-pipe length comprising horizontal section 15 and vertical section 16 and a solar film mount/servo connector 17. The parabolic strip 18 may be draped over the required profile under heat. The horizontal section 15 and vertical section 16 are preferably carbon fiber. The solar cell 100 is mounted within envelope 13 and also comprises mirror film 11. The solar film mount/servo connector 17 is also made from carbon fiber and allows a solar film 12 (at the bottom) and mirror film (at the top) to be mounted at each end. It also provides a mounting for the servo which connects the trough to the body. The mirror film 11 is ideally made of plastic with high optical qualities (such as acrylic) and metalized. Silver is evaporated onto the film in the preferred embodiment with a protective coating (of Silicon or Aluminum to reduce oxidation) or laminated layer (such as acrylic). Alternatively aluminum, platinum, gold or another metal that is highly reflective and ideally inert may be used to metalize the mirror film 11. Thin Solar film 12 is formed around a mounting section. A metalized film runs across the top section. The mirror film 11 reflects sunlight and reduces heat build-up on the rear of the solar film 12 and helps maintain the profile of the solar film 12 across its length.

In the preferred embodiment a copper indium gallium diselenide photovoltaic (PV) panel is used on an aluminum foil back plate (a stainless steel foil or polymer backplate may also be used). NanoSolar of San Jose, U.S. manufacture such a film and has an independently verified efficiency of 14.6% (NREL). A gold nanoball film (or derivitive of this process) maybe added onto of the cell (detailed separately). Any PV thin film may be used including: amorphous silicon (a-Si), copper indium diselenide ($CuInSe_2$, or "CIS"), cadmium telluride (CdTe). Additionally a thin triple matched junction PV cell may be used, available from Spectralabs (Boeing), Sylmar, Calif., USA with an efficiency of over 40.7% under 240 suns or a Inverted Metamorphic Multi-junction (IMM) Solar Cell available from Emcore Corp of Albuquerque, N. Mex. with an efficiency of 40.6% under 326 suns. Such cells may be mounted on both sides of a substrate, for example an aluminum or titanium plate, to form a panel that is mounted vertically.

It should be noted that the focal point for the mirror film 11 is not obvious. Light is bent as it moves through materials of different density. For example as it moved from air to hydrogen, there will be a slight bending inwards of light. In an embodiment in which envelope 13 is filled with Hydrogen, the focal point may be optimized for diffraction through the hydrogen. Likewise, the focal point may be optimized for whichever lighter than air gas is used within the envelope 13.

The envelope 13 defines a compartment for lift gas. It is made from a transparent barrier film, that is ideally cut into panels (for example by waterjet CNC or cutting plotter), and then ultrasonically or RF welded. Alternatively, it may be thermally bonded or joined with an adhesive. Weldable materials are preferred, including Acetal Co/Homopolymer, Acrylic, Acrylic—Impact modified, Acrylonitrile Butadiene Styrene, Cellulose Acetate . . . , Polyamide 6 & 66 (Nylon), Polycarbonate, Polycarbonate/Abs, Polyester—Thermoplastic, Polyethylene—Low/High Density, Polyphenylene Oxide, Polyphenylene Sulphide, Polypropylene, Polystyrene—General Purpose, Polystyrene—High Impact, Polyvinyl Chloride—Flexible, and Styrene Acrylonitrile.

Resins may also be applied to seams and glass/spectra/carbon cloth reinforced to provide a strong joint. The envelope 13 is preferably constructed as a sandwich to incorporate a gas barrier component, normally an adhesive is used to bond the film laminated parts together. Suitable barriers include PvdC, EVOH (EVAL) or PVOH. A typical layer for this purpose will be around 10 µm sandwiched between a 15 µm plastic film (25 µm total). A more preferable alternative is a ceramic barrier that is vacuum evaporated onto a substrate film, SiOx or AlOx, for example that is sold under the trade name Hostaphan. A thin protected film is normally laminated to the ceramic barrier layer. A combination of sandwich films may be applied.

Continuing to move towards the front of the vehicle, a front ballast chamber or compartment 14 is provided with construction as described above for the rear ballast compartment 6.

The operation of the solar cell arrangement is indicated on FIG. 2. Incident light (indicated by arrow 19) is reflected (indicated by arrow 20) from the mirror film 11 towards the solar film 12 and the solar cell.

Extending from opposite sides of the vehicle is a wing 21. This may be made of any bondable material and may be metalized to reflect further light towards the solar cell arrangement. The leading edge 22 is shown in more detail as a cross section in FIG. 1A. The film is wrapped around a carbon fiber strip and bonded to itself. The mid section is shown in more detail in the cross section of FIG. 1B. Two carbon fiber sections are bonded to the wing 21 to form a symmetrical airfoil. This is a low profile aerodynamic structure with little bending. Supports between the leading and training edge may be provided. The trailing edge 24 is shown in more detail in FIG. 1C, the construction is the same as for the leading edge 22. The wing 21 is supported by ring 25 which is connected to struts 26. The ring 25 may be internal or external to the envelope 13. A Thermal Electrical Generator (TEG) Foil insert 13a is position in the chamber 13 as shown in FIG. 1D. A heat sink 13b thermally conducts heat away from the chamber to the TEG 13a, that is cooled on its atmospheric air facing side.

Located within the envelope 13 is a payload 29. A tether wire 28, preferably a UHMWP filament, extends from the payload 29 to tether anchor points 27. The payload 29 contains an actuator, such as a winch servo, which can pull the payload along the main axis of the vehicle for pitch control. The wire 28 may be kept in tension by a spring.

The payload 29 typically comprises: batteries, battery heater, pumps, valves, servo. This is typically a foam container that incorporates the components with an aperture to allow for the movement of actuated movable masses (such as batteries in one embodiment). Electronic components that generate electro-magnetic fields may be shielded in a Mu metal foil that may also draw heat away from the component to the outside of the container (this may reduce interference to any sensors, such as the autopilot). For example permalloys containing approximately 80% Nickel (Ni), 20% Iron (Fe) and small amounts of Molybdenum (Mo). A nickel-iron-molybdenum alloy (permalloy) which offers extremely high initial permeability and maximum permeability with minimum hysteresis loss. The foam container is encapsulated in a plastic film.

The battery 30 may slide along the secondary axis to achieve roll control with an actuator that may be a servo with sliding gear or winch. In some embodiments, the battery may be rotated at speed for control of yaw. The battery 30 is preferably Lithium Sulphur with a specific energy exceeding 260 Wh/kg (commercially available from Sion Power). Carbon nano tube structures may be used as the electrodes to improve the total surface area so more power can be pulled from the cell. Other rechargeable technologies may also be used such as Lithium Polymer and Lithium Ion if larger number of charge cycles are required before replacement, or any other suitable technology, such as lithium air battery cells. A high energy density is preferred to reduce the weight of the vehicle.

FIGS. 3A and 3B is a perspective view of a reinforcing arrangement that may be used for the envelope 13. It depicts only those parts of the aerial vehicle relevant the reinforcement. It comprises a receiving sleeve 32 for receiving a reinforcing rib 33. The sleeve may be welded to the envelope 13. The reinforcing rib 33 is preferably made of carbon fiber. Further support is provided by O ring 34. The reinforcement is optional. Alternate embodiments may include addition reinforcement, for example more O rings 34.

FIGS. 4A and 4B depict an alternative construction for the ballast chamber or compartment 35. Optional film sections 38 may hold the second compartment in position and form a void within the second compartment 35. This has the advantage compared with a film envelope which may be crushed. The ballast chamber is held in tension to maintain a shape (void), so that the chamber does not need to be pre-inflated before air ballast can be accumulated, saving energy and increasing performance. The void is ideally a bi-pyramid. Preferably an eight sided bi-pyramid is used as shown in FIG. 4D (cross section) and isolation from the envelope 13. In other embodiments the bi-pyramid may have more or fewer sides than eight as illustrated by FIG. 4C. These are contained within the outer structure for reduced drag. FIG. 5 shows an optional third compartment 37 in isolation. The third compartment is filled with a refrigerant gas that when in a gaseous state may occupy the void in the second compartment 35. When the second compartment is pressurized, the refrigerant gas changes to a liquid state (occupying approximately $1000^{th}$ of the volume and allows the pump to work in a lower differential pressure regime with higher flow over the compression cycle. The third compartment may be positioned in the first compartment or the second compartment or between the first and second compartment (not shown).

An exemplary wing film structure used in alternative embodiment is depicted in diagrammatic form in FIG. 6A. The wing structure comprises an aerial 40a, which is a circuit pathway onto a film substrate, for use with a transmitter and/or a receiver. A metalized coating may be applied to the film by splutter vapor disposition. The film may be metalized by the deposition of ideally silver, aluminum or gold or any material that can be applied using this method. The circuit pathways are shown for illustrative purposes only and are not to scale. In the preferred embodiment the distance between pathways is a multiple of the radio wavelength of interest. FIG. 6B shows the preferred embodiment that uses a repeatable pattern 40b, that is applied in the metalization of polymer films, using a roller to roller manufacturing technique. Unwanted parts of the circuit pathway can be removed by acid etching (for example, as used in circuit board production) and circuit pathways created with a silver impregnated ink 40c, protected with a resin top coat to isolate the circuit from the elements. FIG. 6C shows the repeated pattern in isolation. FIG. 6D shows an alternative embodiment, with the repeated circuit pattern 40d. Additional circuit pathways 40e are provided in this repeatable pattern that can be used to independently connect other electronic devices or antenna circuits. This technique can be applied to any film parts of the airframe, allowing the entire airframe structure to become a radio antenna. Additionally this technique may be applied to sections, such as the wingtips to create an independent antenna that can be used, for example, for a Synethetic Aperture Radar antenna, with a wide distance between stereo antennae FIGS. 7A, 7B and 7C depict diagrammatic representations of a solar cell for use in the present invention. A Photovoltaic solar cell is depicted at 41. A transparent nano plano-convex polymer film 42 is provided on top of the solar cell 41 in FIG. 7A. Light is bent along the length of the film, so increasing the length of its passage through the PV material, giving a photon a better chance of hitting an electron out of orbit (indicated by arrows 43, showing photon paths). FIG. 7B depicts a transparent nano plano-concaved polymer film 44. FIG. 7C depicts the shorter path length when a nano plano-convex or nano plano-concave film 42 or 44 is not used.

FIG. 8A, 8B, 8C, 8D depicts an alternative embodiment of films with a negative reflective index used on the wings and chambers. A transparent nano plano-convex polymer film 42, is optically bonded to a clear film (typically of higher density) 45. Light is bent as it passes through the plano-convex film 42 and enters the second film 45 of typically higher density and bounces between this film in the same way as light travels down an optical glass fiber filament, until it hits the PV cell at the end of film 41. FIGS. 8B and 8D shows the passage of light through a plano-concaved polymer film 44. FIGS. 8C and 8D show the application of a triple junction coated photovoltaic wire installed within a polymer film. These configurations represent very light weight, very high efficiency solar panels that may be installed into the aerial vehicle. Additionally, the PV cell may be utilized as an antenna to receive radio wavelengths of interest.

FIG. 8 depicts a cross section (side view) through the film that may be used for the first, second or third compartments. The film comprises two base layers components 46, sandwiched between a bonding component that may be a gas barrier such as EVOH (trade name EVAL), PVOH or PvdC and may also comprise further unidirectional reinforcement filaments 48 (running in the x axis) and 49 running in the y axis, of carbon, glass, UHMWP or any reinforcement filament in the class of reinforced plastic composites may be employed. Additional layers of reinforcement may also be used, e.g. triaxially orientated with the filaments aligned at 60°, 120° and 180° for strength and/or flexibility. A plastic film 46 (preferably an ultrasonically or radio frequency weldable plastic material) forms a base layer. It has a thickness preferably from 2 to 80 μm. An adhesive layer 47 bonds plastic film 46 to a first barrier component 48. The adhesive is also a gas barrier component 47 such as PvdC, EVOH (EVAL) or PVOH at a thickness of 2 to 20 μm. A secondary gas barrier component 46b is evaporated onto the first base film that also provides a gas barrier. A second gas barrier component 46b is a ceramic barrier that is vacuum evaporated onto a substrate base film of Silicon Oxide or Aluminum Oxide or other gas barrier that may be applied with this method with a typical thickness of 1 μm. A further layer of adhesive 47 and plastic film 46 are then added to complete the composite sandwich film. In other embodiments the barrier layers may not be used, or only one layer used. However, two layers are preferred to limit loss of lift gas from compartment 13. FIG. 9 depicts a cross section (end view) through the composite sandwich film.

Figure 10B:
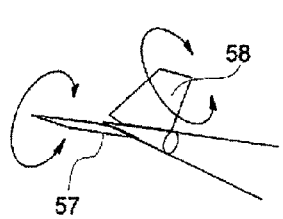
Figure 10C:
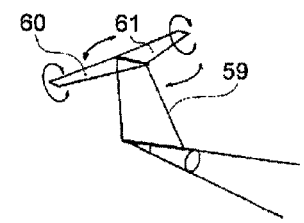

FIGS. 10A, 10B and 10C depict alternative embodiments of control and stabilizing surfaces that may be used with the present invention. In the embodiment of FIG. 10A, a pole or generally cylindrical member 54 extends to the rear of the vehicle. The pole may be tapered and in some embodiments has a paddle or additional control surface appendage (not shown), the member 54 is articulated or pivoted where it extends from the rear of the vehicle. An actuator 55 may move the pole up and down using a linear actuator, such as a servo driving a threaded bar with a retaining screw within the member 54. The whole arrangement may also be rotated and pivoted 56. This allows the member to point in any given direction and achieve yaw, pitch and roll control with minimal drag when not in use. An alternative embodiment in FIG. 10B uses a split rudder 57, 58. It is preferable that the pivot is at the centre of pressure of the stabilizing/control surface (e.g. the quarter chord point from the leading edge), so a smaller actuator can be used. Alternatively, conventional fixed stabilizers with a separate actuated rudder(s)/elevators positioned at the trailing edge. The embodiment in FIG. 10C uses a rudder 59 with elevators 60, 61.

Figure 10E:
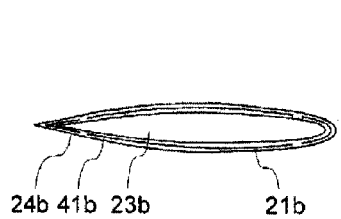
FIG. 10E depicts a cross section of a symmetrical wing.
Figure 10D:
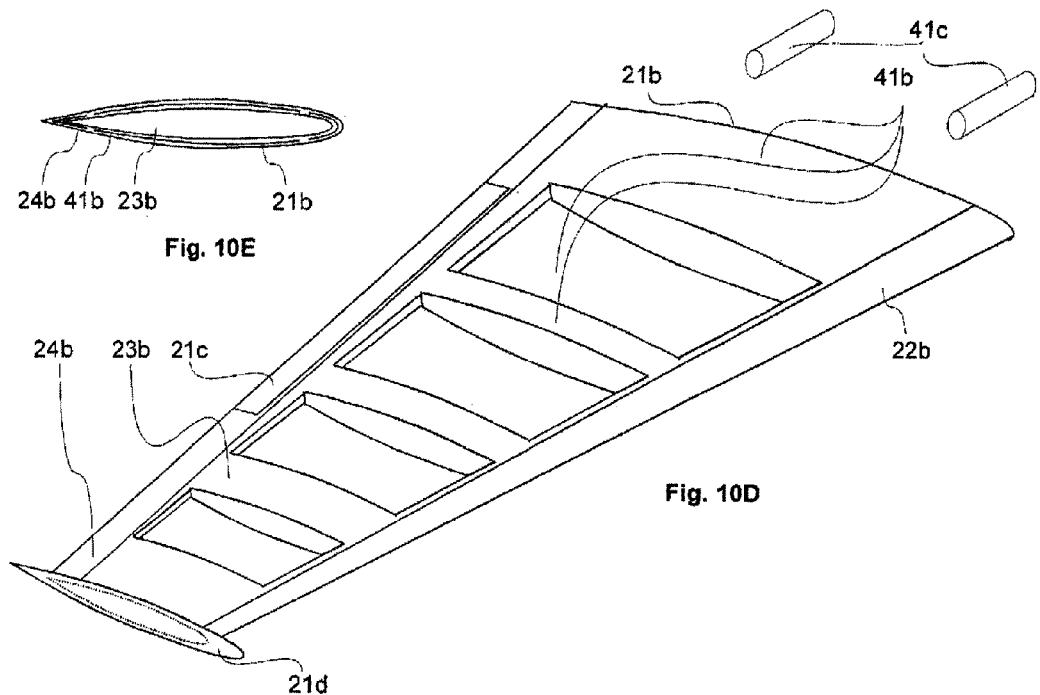
FIG. 10D depicts a diagrammatic representation of a symmetrical wing as an alternative embodiment.

FIG. 10D shows an alternative embodiment of a wing, using a symmetrical airfoil section. Ideally made from a foam core 23b with sections removed to reduce weight. A reinforced carbon fiber or composite reinforced leading edge member 22b and trailing edge member 24b. A Photovoltaic solar panel that is ideally a flexible film that may be implemented over the entire wing surface (top and bottom). A clear heat shrunk film is applied 41b, such as polyester, over the foam core 23b. An optional composite aileron 21c, that is actuated to achieve roll control. A composite wingtip plate member 21d may be attached to the foam core 23b. The wingtip plate reduces vortex induced drag on the wing by providing a fence, so that air cannot roll away from the wing at the wingtip. Unlike a conventional winglet, the fence reduces vortex induced drag on gliding accent and descent. In some embodiments a composite tube member 41c extends through the main chamber (fuselage) and proud of main chamber—not shown and provide a mounting for the wings. The foam core 23b has a receiving aperture (not shown) and wing slide over tube member and attach to the main chamber with a fixture.

Figure 10F:
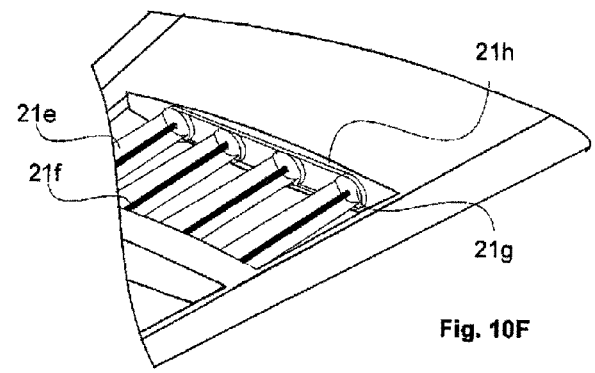
FIG. 10F depicts an alternative embodiment of a parabolic solar trough within the symmetrical wing.

FIG. 10F is an alternative embodiment of the wing previously described in FIG. 10E, that instead, uses parabolic mirror film 21e, to reflect light into a small photovoltaic cell 21f, under concentration. Ideally the PV cell 21f is a triple junction wire type, described herein, but may be any cell known as a photovoltaic cell. The parabolic trough maybe orientated by a servo (not shown). One or more parabolic troughs may be orientated together by a timing belt 21h using a toothed gear 21g. In alternative embodiments, a simple gear arrangement may be used or the troughs maybe orientated individually using separate actuators (not shown).

FIGS. 11A, 11B and 11C depict alternative profiles for the body of the aerial vehicle (excluding wing). FIG. 11A is the most preferred profile. It depicts an axi-symmetrical airfoil body of revolution. The embodiment of FIG. 11B is an axi-symmetrical Vescia Piscis body of revolution. FIG. 11C depicts a further embodiment which has an asymmetric airfoil. This may generate conventional lift (top) or be flipped over to generate negative lift (bottom). Surprisingly, in the embodiment of FIG. 11C, better performance can be obtained if the airfoil is arranged to generate negative lift in gliding ascent (illustrated in the lower part of FIG. 11C), when energy consumption is considered. More energy is generally available when the vehicle is ascending due to buoyancy so the airfoil can have most effect with this orientation. FIG. 11D, illustrates how more than one compartment 64 can be implemented to create a morphed fuselage/wing. A dotted line 65 represents a skin around the compartments. The profiles in FIGS. 11A, 11B and 11C apply to the main body or nacelle of the vehicle.

FIGS. 12A, 12B, 12C 12D, 12E, 12F and 12G depict plan view of the wing profiles that may be used in various embodiments. For clarity these are shown with the body profile of FIG. 11A, although any other body profile may also be used. Next to FIGS. 12A, 12B 12C, 12D, 12E, 12F and 12G are shown diagrammatic representations of the different vertical positions (in side view) relative to the body where the wing can be mounted and to the right of this (in front view). For each is shown a top wing, mid wing (preferred) and bottom wing respectively. FIG. 12A shows a tapered wing embodiment. FIG. 12 B shows a straight wing embodiment. FIG. 12C shows a swept wing embodiment. FIG. 12D shows a delta wing embodiment. FIG. 12E shows an elliptical wing embodiment. FIG. 12F shows a canard wing embodiment. For clarity, this can be a plurality of pairs of wings of any planform, size, type or position In all these embodiments it is preferred that the wing generates minimal lift and is substantially flat or symmetrical to maintain a gliding path, preferably with an angle of attack of ±0.5°. In other embodiments the wing may generate a small amount of lift or have a more pronounced airfoil profile.

FIG. 13 depicts an optional wing tip nacelle 80 that may be provided if extra lift is required. The nacelle 80 forms a further compartment for lift gas or ballast with a construction as described above for the compartments. FIG. 13 represents one or more additional compartments that may be added to the wing, ideally this is at the wingtip.

In a preferred embodiment, for use as an unmanned aerial vehicle, the main nacelle has a body length of 6.8 m and a thickness of 15% of chord length. It will be appreciated that dimensions and chord thickness may be varied depending on the particular application and payload for the vehicle.

Figure 14:
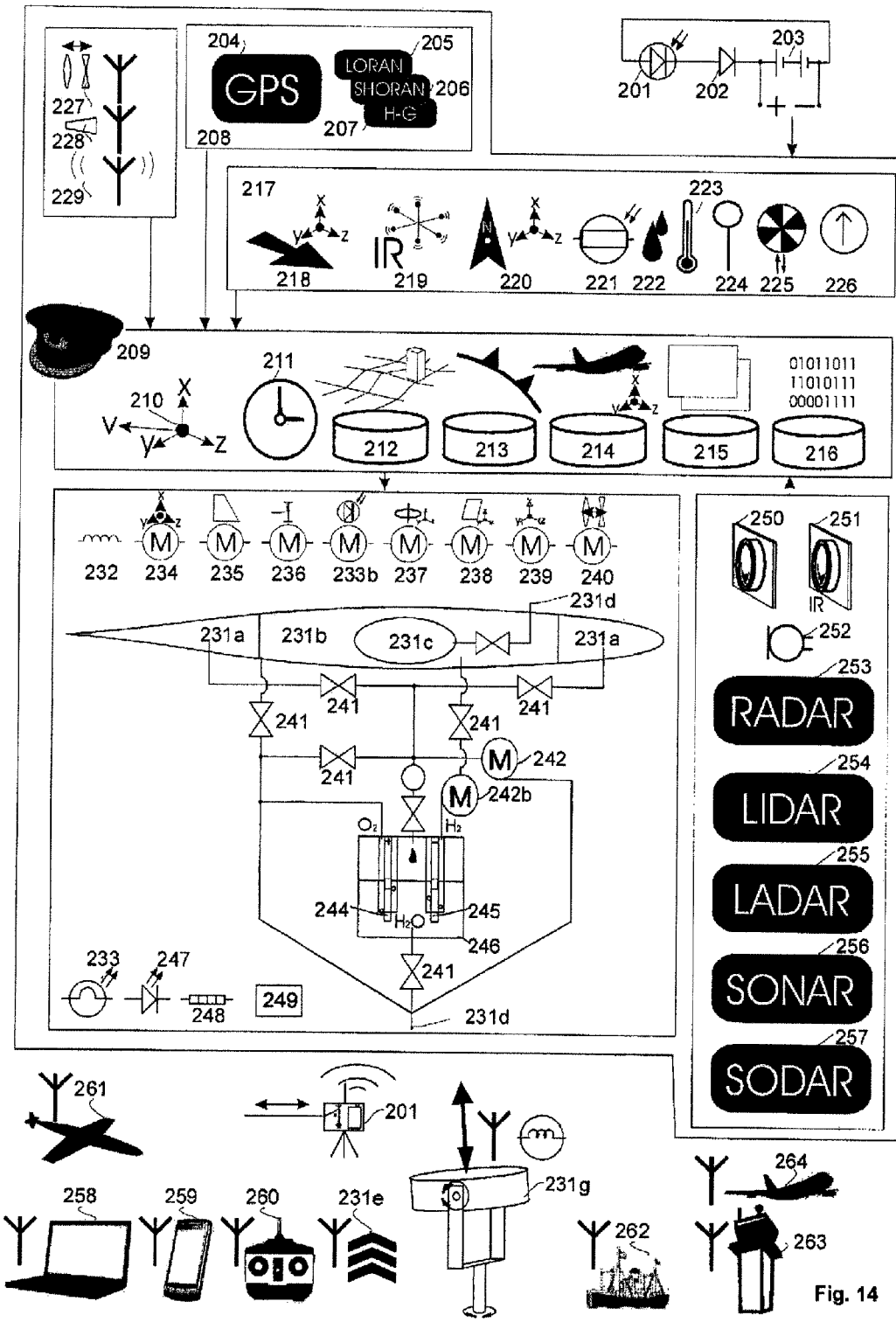
FIG. 14 is a conceptual diagram showing the arrangement of control systems, payload and communication systems within the vehicle of FIG. 1.

FIG. 14 is a conceptual diagram showing the arrangement of control systems and payload within the vehicle. One or more solar cells 201 generates electrical power from incident light. The solar cell 201 is connected through a corrective diode 202 to a battery 203. The diode 202 ensures that power is not drawn from the battery 203 by the solar cell 201 at night. The battery may be Lithium Sulphur supplied by Sion Power with a specific energy of 260 Wh/kg or a lithium Polymer cell (approximately 200 Wh/kg). Carbon nano tubes may be used at the electrodes of the battery 203. Power from the battery 203 is used for the control and electrical systems of the vehicle. In the preferred embodiment a Lithium Air battery is used, experimental cells are available from St Andrews University, Scotland, UK, the theoretical specific energy is as high as 2 kWh/kg.

Block 208 illustrates a positioning system. Various positioning systems that may be included in the invention. One or more of the systems may be included, including more than one system allows redundancy. GPS system 204 may provide XYZ position, 3 axis bearing and speed taken at a sampling rate of 0.25 Hz to 1 Hz with current technology. Alternately a positioning device 205 adhering to the Long Range Navigation System (LORAN) or LORAN-C standard may be provided. A positioning device 206 adhering to the SHOrt RAnge Navigation System (SHORAN) may also be provided. Another positioning device 207 uses a plurality of fixed and known transmission stations with an embedded time code of time of transmission. Any transmission station transmitting a radio signal on any bandwidth which embeds its position and time of transmission may be used. The transmission station may be a surface station.

The vehicle may remain airborne for several days or longer and can therefore assume many of the roles of a satellite, including transmitting a GPS, LORAN-C or SHORAN signal, providing pseudo-satellite functionality.

In an alternate embodiment the vehicle may identify fixed landmarks to establish its own position and then transmit its position and transmitted time code to allow GPS or other navigational system devices to operate, should other GPS or other services be denied. A plurality of aerial vehicles can transmit a position with embedded time code using the appropriate standard to receivers in the area, restoring navigational services. This has the advantage that the signal strength is much stronger compared with a satellite transmission and significantly more difficult to disrupt.

Block 217 illustrates sensor inputs that may be provided. The vehicle may include one or more of:
- a three axis accelerometer 218;
- a three axis infrared sensor 219, which may be used to determine orientation. The sensors point in all directions and the airframe orientation relative to the warm earth and cold sky can be deduced by the relative IR measured.
- a three axis electronic compass 220;
- a light meter 221
- a Hydrometer/humidity sensor 222;
- a temperature sensor 223;
- a pressure sensor 224;
- a rotary encoder 225 to establish the rotary position of a motor;
- a Power meter 226, to monitor the status of the battery.

One or more transmitter/receivers are also provided. For example a lens corrected radio transmitter receiver/transmitter 227. This may focus a signal specifically at a target. For example, it may direct a signal directly at another vehicle for high speed point to point networking or to pickup a weak signal from a specific ground transmitter. The transmitter may be mounted with one or more of the parabolic mirrors described and actuated towards the mirror to change its focal length. One or more transmitter or receiver 228 may integrated into the film of the wings, for example using an aerial 40 as discussed above. A unidirectional transmitter or receiver 229 may also be provided.

An autopilot 209 receives inputs from the positioning system(s) 208, the sensors 217 and the transmitters and receivers 227,228,229. These inputs may be analogue or digital. The autopilot is typically implemented in a microprocessor, ASIC, system-on-chip or any other system that can receive and process information. It generates an output to control the vehicle. The functions of the autopilot are illustrated in graphical form on FIG. 14.

The autopilot 209 is configured to determine 210 an XYZ position and orientation in space. This is done by calculating an expected speed and future position based on a predetermined aerodynamic model and adjusting these with actual data from the sensors. For example, the sensors may reveal wind speed and direction, which may be stored in the Meteorological database (described below) with time stamp. The autopilot 209 may plot a route to a loitering position that may include waypoints by referencing the Meteorological database. The auto pilot may also receive a target position, used to co-ordinate camera and sensor gimbals to look at a target position from its current position.

The autopilot 209 includes an accurate clock 211. Input data may be time stamped. The autopilot 209 also preferably includes storage means such as random access memory, which may be non-volatile such as a flash memory. This storage means can be loaded with various database such as a 3D map 212 of terrain, country boundaries and segregated air space type. Building geometry and other objects of interest may also be included. The autopilot 209 may reference this 3D map to ensure it is not going to collide with any objects or terrain. It may also be used for determining right of passage through airspace.

A meteorological database 213 may also be included. This may comprise data on: wind speed and direction at various altitudes, humidity, sunlight intensity, pressure, chemical composition of air or other meteorological conditions. The meteorological data may be shared with other vehicles and receiving stations. The vehicle may receive met data from external sources for route planning. Reports maybe transmitted via AIREP (Aircraft Report), encoded according to the AFMAN manual 15-124 pages 32-35 or any other accepted Meteorological data reporting standards.

An object of interest database 214 may be included. These may include: other aircraft in the vicinity, ships or vehicles. Ships position are transmitted using the AIS system Automatic Identification System and are required on all ships with a gross weight over 300 tons. The sensors may identify small vessels not equipped with AIS and broadcast these positions across the AIS network. This could be particularly advantageous if the vehicle is used for monitoring by the coast guard.

Aircraft typically transmit their digital position using ACARS (Aircraft Communications Addressing and Reporting System), ADS-B and HFDL standards which could be included in object of interest database 214. Both known positions and sensor feeds may be used to plot a course to avoid airborne objects and aircraft, providing 'sense and avoid'.

A datafeed database 215 may also be provided for storing information from sensors. In addition to the inputs described above, sensor feeds 250-257 (discussed in more detail below) may be stored in the datafeed database 215 with an associated geocode for the position of the feed with an embedded time stamp. Many feeds may be compared from different angles to reveal geometric shapes. The raster information relating to a geometric shaped may be extracted, perceptively corrected and mapped onto the surface of the shape or face within a 3d model. Many feeds may be compared, where the raster information is persistent or similar, this denotes a permanent object. Where a higher resolution source is available the resolution of the base map may be improved. Many sources may be used to composite a 3d model of terrain and permanent objects (buildings and structures). A feed may be compared with the 3d model with mapped surfaces that may be adjusted to compensate for the sun's position and intensity as it hits a face in the 3d model and transitory objects identified as they appear on the base map, which may be passed to the objects of interest database. This database 215 may also be stored externally and updated by the Aerial Vehicle. A subset of the 3d map and related raster information relating to current operating area may be extracted from a central external database and stored in this database.

Another database, setting database 216, may also be provided. This includes the current setting of the vehicle, for example the position of servos.

The autopilot 209 may also include a watchdog system for checking the health of the autopilot and taking remedial action, such as restarting it if necessary. Two or more autopilots may be used in alternate embodiments for redundancy.

The autopilot 209 is connected to various actuators for controlling the vehicle. These include optional Mass positioning servos 234, Control surface servos 235, optional Gyroscope motor 237 (which may be three axis) for maintaining a stable platform for sensors, optional mirror actuators 238, for stabilizing a camera image, optional Gimbal servos 239 which may be three axis to orientated sensors, optional Lens camera servos 240, valves 241, parabolic mirror/solar cell actuators 233b, transmitter/antenna actuation that may include controlling the focal length (not shown), Pump 242, optional Water reservoir 243 (water will accumulate as atmospheric air is compressed and collects in the water reservoir 243. The water may be purged or converted to hydrogen to replace lost lift gas through electrolysis), optional electrolysis unit 246 containing water with anode 244 producing oxygen (typically expelled 231d) and cathode 245 producing hydrogen.

Optional Lamp 233 (a red lamp is presented on the left (port) side, a green lamp is presented on the right (starboard) side, a white strobe light is positioned at top and bottom extremes of the airframe), optional LED 247 with a color scheme as above. The lamps/leds 233, 247 may be within the wingtip section. This would provide sufficient luminosity to meet CAA requirements with little additional drag, optional Electrical heater 248 for heating a battery so power can be drawn in cold operating conditions or heating a refrigerant gas held in the third compartment to change from a liquid state to a gaseous state. A refrigeration unit (not shown) cools a refrigerant gas from a gaseous to its liquid state.

An optional Shielding 249, which is a magnetically shielding metal or Mu metal foil, may surround the components of the electrical system.

The pump 242 is preferably a Diaphragm pump. Any suitable pump for compressing air may be used in alternative embodiments, such as scroll, vane, reciprocating, piston, rotary screw, diagonal, axial flow and centrifugal pumps. A micro pump 242b may be used to pump hydrogen into the main compartment (that may be partitioned in its own chamber). The first compartment may have an additional chamber 231c that is independent filled with a lighter than air gas, should control or communications be lost a valve opened, to vent the lighter then air gas to the atmosphere 231d and reduce overall buoyancy to force a slow descent.

Further actuators may be included for the alternative embodiment including a drogue (described in more detail below with reference to FIG. 17). These include a solenoid 232 for deploying the drogue and a winch servo 236.

Depending on the application of the vehicle, various sensors may also be included. These include an optical camera 250, that may be color or greyscale, CCD, CMOS or line scan. The camera 250 may be mounted on a gimbal and stabilized with gyroscope or mirror gyro, with or without a zoom lens. Providing more than one camera 250 spaced apart allows a range to target object to be determined.

An Infrared camera 251 may be provided, that maybe color or greyscale, CCD, CMOS or line scan. That IR camera 251 may also be mounted on a gimbal and stabilized with a gyroscope or the image stabilized with a mirror gyro, with or without a zoom lens. Spacing two IR cameras apart focusing on a single object allows a range to be established.

One or more microphones 252 may be included. Preferably a number of acoustic sensors are mounted spaced apart to establish a direction and distance to a source of sound. Microphones are preferably mounted at the wing tips and front and aft of the vehicle. The sensors' timing may be compared to establish the direction. This may be referenced against a 3d map to establish a point of origin for the source of the sound.

A RAdio Detection And Ranging sensor 253 may be included. Suitable types include: Monopulse radar, Bistatic radar, Doppler radar, Continuous-wave radar or Synthetic Aperture RADAR (SAR—e.g. A nanoSAR supplied by IMSAR or PicoSAR from Selex). Operating ranges may include the HF to UWB ranges, passive or active. The RADAR sensor may be placed at the focal point for the parabolic trough used for the solar cell.

A Light Detection and Ranging sensor 254 may be included. Suitable types include: Elastic backscatter LIDAR, Differential Absorption LIDAR (DIAL), Raman LIDAR, Doppler LIDAR, Synthetic Array Heterodyne Detection. A Laser Detection and Ranging module 255 may also be used. The LIDAR sensor may be positioned at the focal point of the parabolic trough used for the solar cell.

A Sound navigation and ranging (SONAR) sensor 256 may also be included. This can be Active (infrasonic to ultrasonic range) or passive or Synethic aperture sonar, such as a Vision 600 SAS manufactured by QinetiQ, UK. The sensor may be placed at the bottom of the airframe. The vehicle may land on a body of water to take a reading. Preferably the sonar is independent of the airframe and carried as a payload, within a buoy, the aerial vehicle may drop the payload at the sampling site and recover it using a skyhook or Fulton type surface to air recovery system.

A SODAR (SOnic Detection And Ranging) sensor 257 may also be included. This is for met measurement of wind. A transducer is placed in the solar trough that bounces sound into the atmosphere and returns a sonic signal to the microphones.

The sensor payload may include a projective laser spectroscopy sensor (not shown) currently being developed by St Andrews University, Scotland. This sensor can be used to sample air for chemicals of interest (detecting less than one part in a million). The sensor can either take samples from the air ballast chamber or air that passes over the airframe and in due course may have sufficient range to penetrate to a surface target of interest to establish its chemical composition.

The iconography at the bottom of FIG. 14 shows communication of the vehicle with other equipment. A ground station 258, may allow many vehicles to be controlled and/or coordinated. The ground station 258 may receive the current state of the vehicle settings, receive databases or subsets of the data (212-216), provide new target co-ordinates and waypoints and specify target imaging locations for sensors. Intelligence surveillance and reconnaissance may be provided to the ground station 258. The ground station may be a small portable device 259, such as a mobile phone or PDA, authorised users may control the aerial vehicle by simply specifying a location of interest, the autopilot will then plot a course to this and provide appropriate feeds from sensors to the user that may include providing services. Services provided by the Aerial vehicle may include: data networking, broadcasting its location with embedded timecoding for positioning systems, transmitting the location of objects of interest (e.g. AIS), radio communication to a required standard. These services may be provided to a wide area that may be 100 square miles or more for each aerial vehicle or highly localised, this is achieved with of one or more parabolic mirrors or lens to alter the transmission to a wide or narrow coverage area. Additionally, the aerial vehicle may relay communication at a higher signal strength or utilize another standard, for example a voice call may be made using a mobile phone which is then transmitted to a satellite, allowing a user to access other networks without in this case having to use a satellite phone. A command and control centre 231e, may direct or control the vehicle and receive sensor feeds or access the databases 21 through 216. Additionally the command centre may also specify that alerts are provided for a given set of conditions, for example, a motor car that is exceeding the speed limit. A material with an explosive chemical makeup being identified in the air or a particular vehicle type entering an area of interest. A Safety pilot remote control 260 may allow the vehicle to be operated in civilian airspace or to pilot the vehicle directly from a remote location. A master vehicle 261 may co-ordinate the positions of one or more slave vehicle to maintain a honeycomb mesh data network. A ship 262 may broadcast an AIS signature to the vehicle, that may be relayed allowing the position of the vessel to be known well beyond the normal range of a surface based transmitter. Similarly other vessels that are not equipped with AIS may be identified and their position broadcast across the AIS network. Air traffic control 263 may direct a vehicle directly or provide updated aircraft positions. An aircraft 264 may broadcast its position, bearing and speed to the vehicle.

A ground based light 231g may be controlled and orientated by the aerial vehicle to point towards it and the solar cells 201 orientated 233b towards the light source, unusually the solar cells may be orientated downwards towards earth to receive light from the ground light. This allows additional energy to be provided to the vehicle in low lighting conditions such as winter. Typically the light will be turned on before dusk when light is emitted in the visual spectrum, but may be turned on when required if transmitting outside the visual light spectrum.

FIG. 15 depicts an alternative embodiment of the present invention. The construction is the same as the embodiment of FIG. 1, apart from the description below. In this embodiment the actuated control rod 1500, has a cylindrical control surface 1502 that may provide additional force to orientated the vehicle. The cylindrical control surface 1502 is held in position with struts 1501 that are ideally a symmetrical airfoil cross section and made of carbon fiber reinforced composite. A lightning rod 1503 is provided, ideally made of a carbon fiber reinforced composite tube with a symmetrical airfoil cross section into which is placed a conductive wire of silver. Should lightning strike the vehicle, the lightning rod communicates this electrical energy though the conductor as to not disrupt or damage electrical system operation. Actuated parabolic mirrors 1504 are provided and described further in FIGS. 15C, 15D, 15E, 15F, 15G and 15H. The parabolic mirrors 1504a maybe orientated to receive and transmit a radio transmission from another station as illustrated by 1505. Similarly another parabolic mirror 1504b maybe orientated towards the ground to receive light from a ground based light 1506. The vehicle has a hydrogen storage chamber 1499, that can be presented to a fuel cell to produce electrical power or used as fuel to power an engine, such as a wankel or reciprocating engine, to drive the pump 242 or a conventional method of propulsion to provide bursts of speed to assume a loitering position (not shown). Conventional methods of propulsion may include a propeller or jet engine. The hydrogen storage chamber is preferably cylindrical or spherical and may be constructed of fiber reinforced polymer composite or light weight metal or metal alloys, including aluminum or titanium.

FIG. 15a illustrates the ground based light, that comprises a light emitter 1509. Light emitted 1509 may be a flood light or a light emitter beyond the visual spectrum, such as an infrared LED, that emits light ideally between the 700 to 3000 nanometer range. The light is directed to the vehicle using a parabolic mirror or lens to produce a shaft of light. Alternatively a coherent light source may be used, such as a laser. A megatron that produces light in the microwave range may also be used (but not preferred). By example, a 10 kW light source emitting light for 1 hour (assuming 90% optical losses in the atmosphere) is sufficient to sustain the airframe at a groundspeed (excluding wind) of around 75 kms/hr throughout the night, in the month of December in London, England. In the case of a fixed position ground light, the absolute position of the ground light is known (it may also be transmitted to the vehicle for movable surface lights) the required orientation is calculated and transmitted to the light source 1506. Servos 1507 and 1508 orientated the light and emit light 1509 on demand to the aerial vehicle.

These are received by concentrated solar panel collector on the vehicle 1504*b*. The light ground station may be powered by solar power and installed on a buoyant platform that maybe tethered for oceanic applications.

FIG. 15*b* shows an alternative embodiment, where the first lift compartment 1511 is positioned to the front and rear of the vehicle and secondary ballast compartment 1512 is presented in the middle of the vehicle around the wing. A lighting rod 1513 is situated at the mid point (previously described) but extends around the main fuselage.

FIG. 15*c* represents a detailed perspective view of an alternative embodiment of the solar cell collector 1504 illustrated on FIG. 15. A film sleeve 1514 is bonded to the outer envelope, a carbon fiber member 1515 is inserted to hold the mechanism and houses a pivot 1516. A actuator 1518 rotates an outer carbon fiber ring 1517 to achieve yaw. A second actuator 1519 achieves pitch to rotate an inner carbon fiber ring 1520. A parabolic mirror is made of mirror film (described above), mirror film sections 1522*a* are bonded to a centre section 1521 and attached to the inner carbon fiber ring 1520 with an adhesive. An optional outer mirror film ring 1523 may be added. The mirror films create a parabolic mirror 1529 as shown in FIG. 15D in cross section. A carbon fiber member 1524 holds a solar cell 1526 and corrective mirror 1525 in position. Ideally the corrective mirror is a silvered mirror foil, such as Silver Miro supplied by Alanod of Germany. The solar cell is ideally a high efficiency concentrator photovoltaic cell previously described, but may be any PV cell that creates electrical energy from sunlight. An additional linear actuator 1528 may be used to control the focal point of a radio transmitter/antenna 1527. FIG. 15D shows incoming light 1530 being reflected from the parabolic mirror 1529 and a corrective mirror 1525 into the solar cell 1526. FIG. 15E in perspective view and 15F in cross sectional view show an alternative cassegrain embodiment. Light 1530 is reflected from the film mirror 1522*b* onto a secondary mirror 1525 and into a solar cell 1526. FIG. 15F in perspective view and 15G in cross sectional view, show an alternative off-centre parabolic embodiment.

FIG. 16 depicts an alternative embodiment of the present invention. The construction is the same as the embodiment of FIG. 1, apart from as described below. In this embodiment the solar cell arrangement is configured so that the mirror film 1602 can move independently of the solar cell 1604. FIG. 16A depicts a cross section through the solar cell arrangement, showing how the solar cell 1604 is located around the central axis of the vehicle. This is enabled by a central channel running along the length of the vehicle along its main axis. The central channel is depicted in the cross section of FIG. 16B. The mirror film 1602 rotates around the aperture. The solar cell 1604 rotates independently of the mirror film 1604 from within the aperture. This allows cooling of the solar cell.

FIG. 17 depicts a further embodiment of an aerial vehicle according to the present invention. The construction is the same as the embodiment of FIG. 1, expect as described below. This embodiment includes a drogue or anchor that can be released to drag in a body of water below the vehicle, for example the sea or a lake or river. This embodiment is particularly useful to maintain a position against strong winds, or for applications by the coast guard or for oceanic operators. The use of the drogue can enable the vehicle to maintain a height below 60 m—necessary if the vehicle is used as an unmanned aerial vehicle under an autopilot in UK airspace. Territorial airspace extends twenty four nautical miles from the coastline—at that distance a higher altitude can be used. A conventional propeller 99 may be used to achieve steady, level flight at low altitude. The drogue creates significant drag in water to keep the vehicle in position in high wind for oceanic applications, saving significant energy that would otherwise be required for propulsion to keep the unit at station. Typically, the unit drifts with the use of a drogue by $\frac{1}{30}^{th}$ the distance compared to not using the drogue.

The vehicle comprises an aerodynamic compartment 94 (preferably foam) with plastic film skin. This compartment includes an actuator that may be a winch servo 95 to retract or deploy the tether line 100 and an IR emitter 96 for communication with the drogue 105. Towards the rear is a permanent magnet 97 which mates with the drogue magnet 102 so that when it is not in use it is maintained close to the body of the vehicle with a carbon fiber member 104. When required, the drogue 105 is released by operating an electromagnet 98.

This embodiment includes a propeller 99 at the rear of the vehicle. The propeller is driven by a motor. It is provided to assist flight at low altitude, for example 60 m or lower, where the buoyancy method of propulsion cannot be used as efficiently because of the small vertical range available.

The drogue 105 is connected to the vehicle by a tether line 100. A drogue control unit 101 is attached to the bottom of the tether line 100. The outer surface of the control unit 101 is a solar panel to charge the unit. Drogue unit tether lines 105*a* extend from the control unit 101. A retraction line 106 is also provided. The drogue includes a permanent magnet 102 mounted on a carbon fiber strip 104 that fits the profile of vehicle when the drogue is not deployed. The drogue 105 itself is made of a thick grade of polymer film described above. In FIG. 17 the drogue is shown deployed below a water level 1700.

FIG. 17A depicts the control architecture for the drogue 105. It includes a battery 107, IR receiver 108, Winch servo 109 and solar panel body 110.

Another embodiment of the invention is depicted in FIG. 18. This embodiment is identical to the embodiment of FIG. 1, except as described below. In this embodiment a wing extends between two or more nacelles at each side of the vehicle.

A wing, which can have profiles as described above, supports a solar cell 111 on its upper surface (and lower surfaces in some embodiments). An opening is formed in the solar cell 111 in which is suspended a symmetrical airfoil payload section 113 by lines 112. The payload section carries batteries and winch servos that can move the payload around to move the centre of gravity of the vehicle to orientated and control the vehicle. As depicted in FIG. 18, the nacelles 1799 at each side of the vehicle do not contain a solar cell arrangement, although in alternate embodiments this may be provided instead of or in addition to the solar cell 111. The nacelles include a pump 114 for filling the ballast chambers.

The wingspan carbon fiber section used in the embodiment of FIG. 1 may be used in this configuration on the leading and trailing edge to reduce bending across the wing (indicated generally by numeral 115).

Thus, according to the invention, the vehicle comprises a main nacelle or nacelles with rudder and elevators. The rudder and elevators are preferably made of a carbon fiber frame (water-jet cut sheet), film covers the frame. The rudder is preferably actuated at the centre of pressure so that a small servo can be used. The servo is preferably housed in the rear polystyrene compartment that also houses the control unit, GPS unit, transmitted/received and other antenna.

The polystyrene container may have a carbon fiber cap with a tail running along the rear compartment to provide additional stability for the control surfaces. A film nacelle envelope covers the cap and is preferably secured with a reinforced composite of fiber and resin to provide an air tight seal, that may be secured with a fixture.

The main nacelle is preferably made of EVAL (Ethylene Vinyl-Alcohol Co-polymer) barrier between one or more polymer films with an additional ceramic coating. The barrier film composite has a low demonstrated helium permeability of 160 cc/m$^2$/atm/24 hrs without an additional ceramic coating. Eight sections of film make up the nacelle section, which may be bonded with an ultrasonic/radio frequency welding machine to provide a good seal. The seams are reinforced on the reverse of the seal with fiber reinforced tape to provide a strong joint. EVAL offers 100 times less helium permeability compared with Mylar. This would result in helium loss of 6.91 cc/m$^2$/ATM/hr through the film, or 0.943 l/day for the preferred and exemplary embodiment.

For the embodiment of FIG. 1, this provides a theoretical lift endurance of 239 days with a 50% loss of free lift, resulting in reducing the upper operating altitude from 3 km to around 2 km.

Solar energy is reflected using a parabolic mirror made of mirror film in the solar cell arrangement. The film is preferably adhered to a carbon fiber frame at each end. Servos orientated the solar trough to harvest available sunlight. Sunlight is concentrated onto a photovoltaic receiver, facing towards the mirror film. The photovoltaic cell is attached to the carbon fiber frame and the top section (not shown) is made of mirror film which reduces heat build-up on the reverse of the photovoltaic film and maintains the elliptical profile of solar film across its length. This arrangement reduces the overall mass of the craft and also allows the sun's path to be tracked, maximising energy yield.

The component compartment is preferably made of polystyrene and encapsulated in Mylar film, it may house a winch servo to move the component compartment forward and aft, moving the mass along the main axis of the craft to provide pitch control. A servo moves the battery in a perpendicular horizontal plane to the main axis, to provide roll control. The waste heat from the pump keeps the batteries within operating temperature range. The pump is preferably also housed within the polystyrene container and connected to a solenoid valve. Ventilation and a Mu metal foil draw heat away from the pump when in operation. A pipe draws in atmospheric air to the pump and two pipes run the length of the craft to the air ballast chambers.

As atmospheric air is pumped, water builds up in the feed pipes. This water is collected in a container attached to the feed pipes and may either be purged when the valve is switched or presented to an electrolysis unit for processing into hydrogen to replace helium lift gas lost through the envelope. To replace 40 cc of helium lost per hour will require electrolysis of 0.7 cc of water per day, to liberate hydrogen to replace the lost lift gas.

The endurance of the Aerial Buoyancy Glider is unlikely to be limited by lighter-than-air gas loss, but more likely the effective battery recharge cycles. Lithium Sulphur batteries are preferred as they have the highest specific energy per kilogram (350 Wh/kg, 260 Wh/kg realized at the pack level). However, the recharge cycles are likely to be only 60-90 cycles. Alternatively, Lithium Polymer batteries would offer an attractive alternative for longer term (1000 cycles +, with a lower specific energy of 206 Wh/kg). Other battery technologies may also be used, such as lithium air that may offer higher specific energies.

The wings extend from main compartment, but may be combined in some embodiments

Having described the construction of various embodiments, the principle of operation of the present invention will now be discussed. The present invention derives motion from alternating upward and downward movements. The vehicle rises under a buoyancy force resulting from the lift gas contained within the first compartment. The vehicle falls by increasing its mass by pumping atmospheric air as ballast into the ballast compartments. It can then rise by expelling the air compressed in the ballast chambers.

Figure 19:
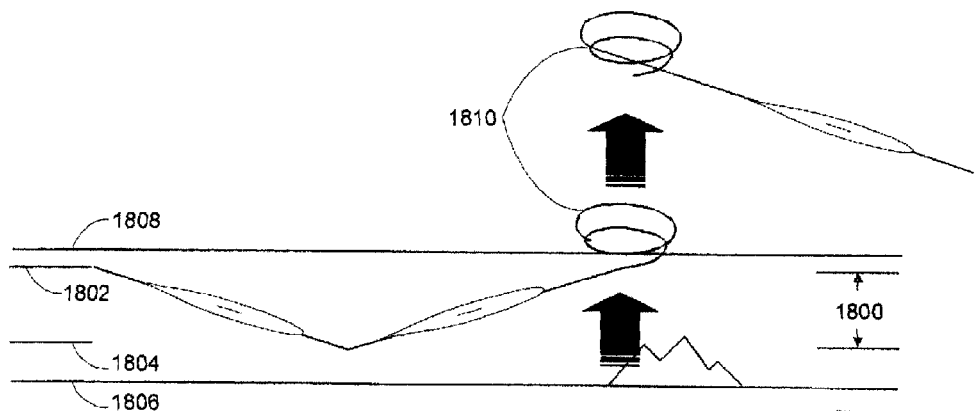
FIG. 19 is a conceptual diagram illustrating the method of flight of the present invention.

During the upward and downward motion the orientation of the vehicle is controlled such that a horizontal motion component arises. For example this may arise by force provided by a wing, or by the shape of the main body of the vehicle itself. The resulting motion resembles a "zigzag" or "saw tooth" when viewed from the side. The motion is depicted in FIG. 19.

The vehicle may alter this gliding path over this cycle to minimize energy usage (typically a longer gliding inflection with a longer gliding distance) or increasing airspeed (typically a shorter gliding inflection with shorter gliding distance). The gliding angle may also be changed throughout this cycle to maximize ground speed or energy usage.

The vehicle operates over an altitude range 1800, which is typically 2 km or more in a preferred embodiment. The altitude range has an upper limit 1802 and lower limit 1804 above the ground level 1806. In a preferred embodiment the upper limit 1820 is 3 km or more above ground level and the lower limit 1804 is 1 km or less above ground level. The volume of the main compartment of the vehicle containing the lift gas will determine the buoyancy of the vehicle and the overall buoyancy ceiling 1808 where the density of the vehicle equals the density of the surrounding air. The vehicle may rise above the buoyancy ceiling by circling on thermals 1810 in the same way as gliders, if thermals are available.

Figure 20:
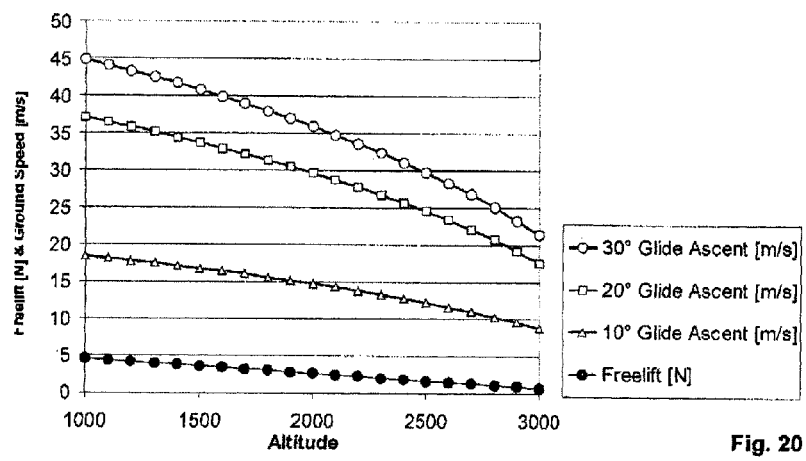
FIG. 20 is a graph showing freelift and ground speed versus altitude for different angles of ascent.

The method of the present invention uses buoyancy to translate a vertical force to horizontal and vertical force components through the wing giving ground speed. In a preferred embodiment the overall mass of the vehicle is 1.7 kg with 2.3 m$^3$ of helium generating free lift of 0.712 kg at sea level. As the glider rises through the atmosphere, the air density decreases reducing buoyancy, resulting in free lift of 0.489 kgs at 1000 m altitude, falling to 0.09 kg of free lift at 3000 m. FIG. 20 shows ground speeds for various gliding ascent inclinations.

As the glider ascends, the control surfaces are orientated and/or internal masses are repositioned to change the centre of gravity/buoyancy to orientated the craft at the desired glide angle. At the top of the ascent, a gas pump draws in atmospheric air which is stored in the air ballast chambers located at the front and rear of the vehicle.

The ballast compression chambers have a combined volume of 0.46 m$^3$ in the preferred embodiment and can withstand a pressure of up to 3.8 Atm, though typically pressurized to a differential pressure of 1.5 Atm. A suitable pump may be fabricated using light weight components with a weight of only 500 grams.

Figure 21:
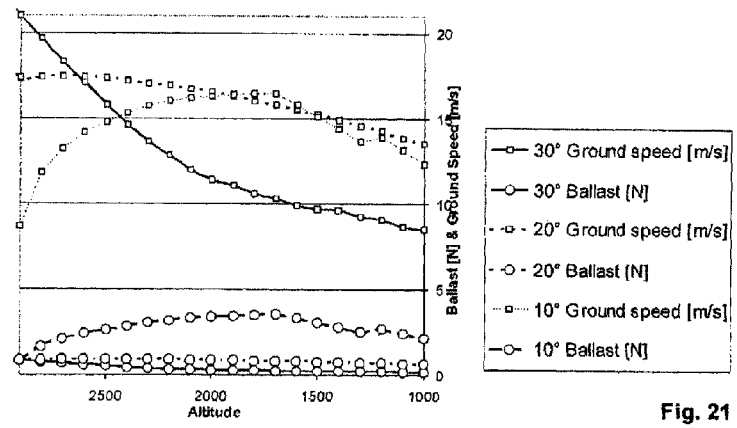
FIG. 21 is a graph showing ballast and ground speed at various gliding descent angles.

The pump's performance varies with the differential pressure between the atmospheric air drawn in and output pressure of the compression chamber, pumping 120 liters/min at atmospheric pressure, falling to 40 liters per min under 1.5 Atm differential pressure. Air ballast may accumulate at a rate of around 100 grams per minute at the beginning of the gliding descent; however this is offset by the increase in buoyancy as the craft falls. The pump must therefore pump sufficient atmospheric air to offset the increase in buoyancy to maintain a heavier-than-air state to achieve a gliding descent, as shown in FIG. 21.

At the bottom of the gliding descent, a valve is opened, allowing air ballast held in the compression chamber to be expelled. It is important to note that some pressure is held within the air compression chamber so that the chamber is fully inflated. The valve is pulsed to keep the air compression chamber pressure above atmospheric pressure throughout the ascent glide.

The preferred embodiment is designed to operate within a 1-3 km altitude range, however if thermals are available, the glider can circle to obtain greater altitude. Other operating ranges can also be used, for example changing the mass of the vehicle or increasing the volume of lift gas to extend this operating altitude range.

Should wind offer useful assistance, then it may be utilized. This is particularly relevant for travelling to a desired destination. Altitude wind measurements may be gathered and transmitted to other aerial buoyancy gliders for this purpose.

The vehicle can attain altitudes considerably higher than the buoyancy ceiling of 3.5 km by utilizing thermals, ridge lift, or lee waves. This would allow high speed winds to be utilized to travel considerable distance at speeds beyond the method of buoyancy propulsion alone, not necessarily a straight line flight path to the destination. In particular it is envisaged that jet streams may be utilized in some embodiments.

The aerodynamic model utilized to control the vehicle of the invention and the method of flight will now be discussed with reference to the embodiment of FIG. 1. For the sake of illustration the lift and drag coefficients for the lift nacelle are taken from Online Panel Codes for a LWK 100-80, Department of Aeronautics and Astronautics, Naval Post Graduate School, United States Navy. The lift and drag coefficients for wing are based on a flat plate.

$$C_{d\alpha} = 1.28 \sin \alpha$$

$$C_{l\alpha} = 2\pi\alpha \quad (1)$$

The total drag takes into account vortex/induced drag at small angles of attack. The aspect ratio for the wing is 6 (with a 0.3 taper ratio) and 0.068 for the nacelle. e is the elliptical factor, assumed to be 0.95 for the wing (which is a reasonable for a wing of this aspect ratio and taper) and 1.0 for the nacelle, as it is a good elliptical shape.

$$C_{D\alpha} = C_{d\alpha} + C_{di}(C_l^2/\pi eAR) \quad (2)$$

Figure 22:
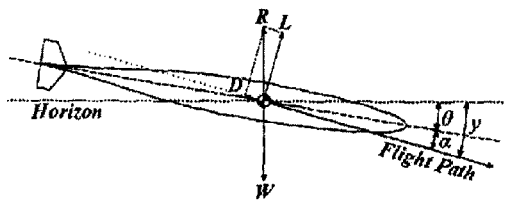
FIG. 22 depicts an equilibrium gliding descent.
Figure 23:
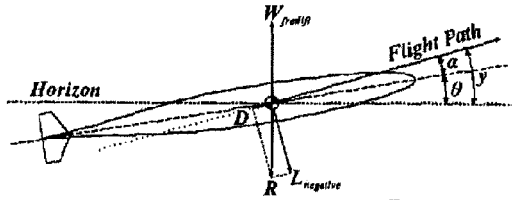
FIG. 23 depicts an equilibrium gliding ascent.

The angle of attack ($\alpha$eq) is derived from the equilibrium glide angle, which varies between 0.07° to 0.00096° for glide angles of 8.8° to 58°, respectively. FIG. 22 depicts an equilibrium gliding descent and FIG. 23 depicts and equilibrium gliding ascent.

Figure 24:
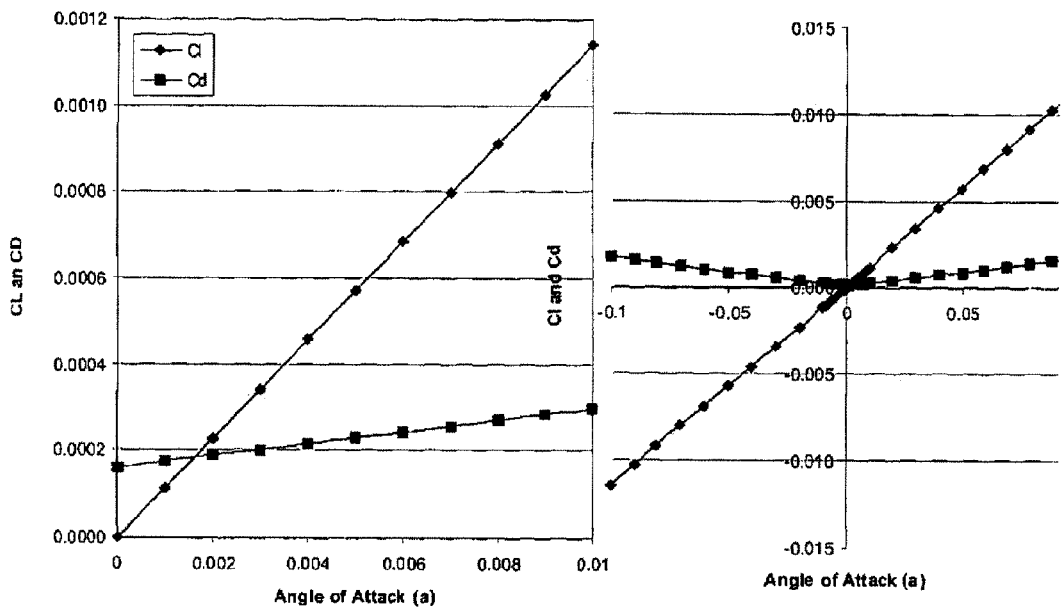
FIG. 24 is a graph of lift and drag coefficients with angle of attack.

The coefficients are based on planform areas of 3.187498 m² and 4.68 m² for the nacelle and wing, respectively. The total airframes coefficients are the average of the nacelle and wing (excludes the control surfaces). The low CD is a result of not needing to create aerodynamic lift, other than to keep the vehicle on the glide flight path. FIG. 24 shows the lift and drag coefficients with angle of attack.

The minimum glide path angle is achieved at L/Dmax:

$$\tan\gamma_{min} = -\frac{C_{D\alpha}}{C_{L\alpha}} = -\frac{0.001235}{0.007981} = 0.15478 \therefore \gamma = 8.8° \quad (3)$$

The airspeed is derived at the equilibrium glide angle. In this case, the speed at the minimum glide angle.

$$V_{glide} = \sqrt{\frac{2W}{\rho_{2000m} S_1 \sqrt{C_D^2 + C_L^2}}} = 11.02 \text{ m/s} \quad (4)$$

The LWK 80-100 is used as a reference airfoil. Other airfoils may also be used. At small angles of attack, little aerodynamic lift (negative lift on a gliding ascent) is generated and the associated vortex/induced drag is minimal.

In summary, the vehicle is a lightweight hybrid aircraft that uses a buoyancy engine to translate a vertical force to horizontal and vertical force components through a fixed flat plate film wing. The glider has sufficient airspeed to penetrate winds that may be encountered (other than the most extreme winds), offers a very efficient method of propulsion and may harvest sufficient solar energy to power on-board systems at most global locations throughout the year (at an approximate Latitude range ±56). The unit may effectively operate at latitudes ±57° to ±63° for 10 months of the year and ±64° to poles for 6/8 months of the year.

Possible applications of the vehicle will now be discussed. The vehicle is an inexpensive platform, with very long endurance and as such, provides a near permanent aerial platform for Earth observation and networking.

The vehicle provides a useful persistent aerial platform for scientific sensors, meteorological data gathering and imaging equipment (including; Synthetic Aperture RADAR, high resolution optical camera and infrared camera). The vehicles may either loiter over a single location to provide on-going situational awareness or survey wide areas. Working autonomously, the vehicles do not necessarily require a manned ground station, can operate for months at a time, needing minimal support infrastructure and do not require a landing runway when scheduled maintenance is required.

Figure 25:
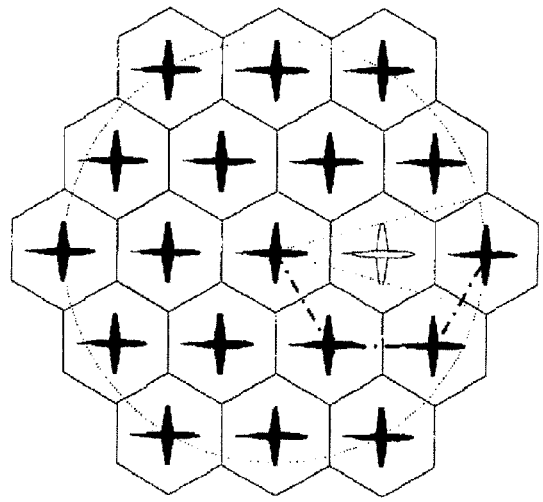
FIG. 25 depicts a mesh network application.

By way of illustration, commercial-off-the-shelf CISCO equipment can be used to create an aerial IP based network access point. A number of vehicles may be deployed in a honeycomb formation as shown in FIG. 25.

For a high bandwidth network, a distance of 5 km between vehicles can provide a bandwidth of 48 Mbs. Bandwidth falls off to 11 Mbs at 16 km and 2 Mbs at 25 km distance between nodes.

By way of example, fifteen vehicles may provide blanket wi-fi access across Greater London. For oceanic networking, a persistent over-the-horizon data network would be desirable for ship-to-ship and ship-to-shore communication that does not require expensive geo-stationary satellite communication usage.

Bandwidths can be significantly increased for point-to-point communication.

The vehicle's weight is typically 1.7 kgs to 3 kgs packaged weight (approximately the size of a one-man tent). When the unit is deployed, the envelope is unfolded, the wingspan sections attached and the main envelope inflated from a lighter than air gas canister, such as helium. The vehicle does not require a bulky launch catapult or runway and may be launched from a small naval ship or practically anywhere in the field. For advanced deployed units, it is noted that pressurized helium should not be carried onboard an aircraft and an off-the-shelf electrolysis unit maybe used to inflate the glider with hydrogen.

The vehicle typically operates at an altitude of 1-3 km, but may operate at much higher altitudes by utilizing thermals or an alternative embodiment that generates more freelift. The envelope and wing are transparent, the solar cell arrangement may be printed on the reverse to reduce its visual footprint. The unit operates beyond the range of ground rifle fire. The vehicle flies silently and offers minimal clues to its presence from the ground. The vehicle has minimal thermal signature and has 'bird-like' radar signature and flight characteristics.

A Kestrel autopilot commercially available from Procerus Technologies, 500 South Geneva Road, Vineyard, Utah 84058, USA may be used, providing autonomous flight operation with seamless camera alignment, e.g. the unit does not need to be piloted and aerial imagery is provided on request by simply specifying a co-ordinate, the autopilot takes care of the rest.

An easy field implementation would be to use a wi-fi enabled 'smart phone' to request aerial Intelligence, Surveillance and Reconnaissance (ISR) with ongoing situational updates provided on-screen or other services described above, thus an aerial unit may be under the direct guidance of a small unit. The vehicle provides the network access point and the ISR. In the context of a field-wide network, the ISR feed may be provided to command for further image processing and objects of interest identified and, where applicable, concise situational updates provided to the required field personnel.

If the vehicles operate in non-military airspace, then they can be piloted. The autopilot allows multiple craft to be operated by a single pilot. With further development, it is envisaged that the guidance system could include consideration of:—
  Dynamic global 3D wind map
  Prediction of the likely occurrence of thermals from the lie of the land and time of day
  Optimize aerial energy sources (thermals, glide path, high speed winds and solar energy)

The vehicle has endurance well beyond the current generation of tactical Unmanned Air Vehicles (UAVs), which require readying, piloting to a required position to obtain limited ISR, piloting back to a ground station, recovery and servicing. The vehicle simply remains at a loitering station providing ongoing ISR and radio communication services. Other aircraft may be more capable in terms of airspeed, operating altitude and sensor ranges, however, they require considerable manpower to operate, have a significantly higher capital cost, associated running costs and need to be refuelled and ultimately land for maintenance which can be both time consuming and costly. Monitoring the routes used by Military ground vehicles and convoys is a single function the vehicles may perform amongst many other useful roles.

The vehicle offers a very low cost, persistent aerial platform with very long endurance. As the vehicle operates at a low operating altitude, less power hungry sensors and communication equipment can be used. Ad hoc aerial networks are known, offering line-of-sight radio communication to a ground receiving station. Aerial assets form ad hoc connections between nodes, however, these networks can only take place if an aircraft is over a particular location. If there are no aircraft in the sky, there is no network. The vehicles would allow a planned network to be established over a very wide area, with consistent bandwidth and access.

The vehicle is well suited to an IP based network infrastructure. The vehicles would allow a low-cost field-wide IP based network to be provided alongside the existing infrastructure and facilitate a high bandwidth global telecommunication network.

A unique feature of the vehicle is that the vehicle may land on a body of water or deploy and recover sensors. For example, make an active sonar sounding and undertake another sounding elsewhere without the location of the host control vessel being determined Additionally, the vehicle could be used in international waters to monitor merchant ships and interests, covering a wide patrol area. There has been an increase in Pirate activity off Somalia (the significant coastline is around 1000 km), with 93 attacks reported in 2008. Around 20 vehicles could provide networked surveillance of this coast, to detect any ships entering the shipping lanes. The location of all ships could then be passed across the AIS network to all merchant ships in the area and the position of suspicious vessels passed to NATO Naval vessels in the vicinity for further investigation.

The invention claimed is:

1. A method of unpowered forward flight for an aerial vehicle, the aerial vehicle comprising an elongate envelope having a nose and a tail and a longitudinal axis between the nose and the tail, the envelope comprising at least one first compartment for holding a lighter than air gas and at least one second compartment for holding air, the second compartment comprising an inlet and an outlet, a one pair of fixed wings extending laterally from the envelope between the two ends, in level flight the wings having a zero angle of attack, the wings being symmetrical about a wing axis perpendicular to the longitudinal axis, the method comprising the steps of:
  raising the vehicle into the atmosphere and achieving neutral buoyancy by a balancing downwards force of the air in the second compartment(s) against upwards force of the lighter than air gas in the at least one first compartment;
  reducing buoyancy of the aerial vehicle by pumping air out of at least one second compartment pitching the nose of the vehicle downwards to accelerate the vehicle on a downwards glide path; then pitching the nose of the aerial vehicle upwards and at the same time releasing the compressed atmospheric air from the second compartment to project the vehicle on an upward glide path;
  as the vehicle tends to a stall, reducing the buoyancy of the vehicle by pumping air into the at least one second compartment pitching the nose of the vehicle downwards to accelerate the vehicle on a downwards glide path; then pitching the nose of the aerial vehicle upwards and at the same time releasing the compressed atmospheric air from the second compartment to project the vehicle on an upward glide path;
  repeating the previous step to maintain forward motion.

2. The method according to claim 1 in which the aerial vehicle has at least one forward atmospheric air compartment behind the nose of the vehicle, and wherein the nose is pitched downwards or upwards by increasing or decreasing the volume of air in the said compartments.

3. The method according to claim 1 in which the aerial vehicle has at least one rearward atmospheric air compartment in front of the tail of the vehicle, and wherein the nose is pitched downwards or upwards by decreasing or increasing the volume of air in the said compartments.

4. The method according to claim 1 in which the aerial vehicle has at least one forward atmospheric air compartment behind the nose of the vehicle and at least one rearward atmospheric air compartment in front of the tail vehicle, and wherein the nose is pitched downwards or upwards by pumping air from the forward compartment(s) to the rearward compartments(s).

5. The method according to claim 1 in which the nose is pitched down or up by moving one or more internal components forward towards the nose or backwards away from the nose.

6. The method according to claim 1 in which pumping of air is undertaken by a pump powered by solar energy.

* * * * *